US009159414B1

(12) United States Patent
Derhacobian et al.

(10) Patent No.: US 9,159,414 B1
(45) Date of Patent: Oct. 13, 2015

(54) PROGRAMMABLE IMPEDANCE ELEMENT CIRCUITS AND METHODS

(71) Applicant: Adesto Technologies Corporation, Sunnyvale, CA (US)

(72) Inventors: Narbeh Derhacobian, Belmont, CA (US); Shane Charles Hollmer, Grass Valley, CA (US); John Dinh, Dublin, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 104 days.

(21) Appl. No.: 13/657,568

(22) Filed: Oct. 22, 2012

Related U.S. Application Data

(62) Division of application No. 12/767,732, filed on Apr. 26, 2010, now Pat. No. 8,294,488.

(60) Provisional application No. 61/172,696, filed on Apr. 24, 2009.

(51) Int. Cl.
*H03K 19/173* (2006.01)
*G11C 13/00* (2006.01)
*H03K 19/177* (2006.01)

(52) U.S. Cl.
CPC ...... *G11C 13/0069* (2013.01); *H03K 19/17736* (2013.01)

(58) Field of Classification Search
CPC ............... G11C 13/0069; H03K 19/17736
USPC .................. 326/37–41, 47; 365/148, 163
See application file for complete search history.

(56) References Cited

U.S. PATENT DOCUMENTS

| | | | |
|---|---|---|---|
| 6,215,699 B1* | 4/2001 | Yamamoto | 365/185.09 |
| 6,380,636 B1* | 4/2002 | Tatsukawa et al. | 257/390 |
| 6,795,346 B2* | 9/2004 | Otani et al. | 365/185.24 |
| 7,209,379 B2* | 4/2007 | Mori et al. | 365/148 |
| 7,471,543 B2* | 12/2008 | Nakashima et al. | 365/148 |
| 8,149,610 B2* | 4/2012 | Chen et al. | 365/148 |
| 8,294,488 B1* | 10/2012 | Derhacobian et al. | 326/38 |
| 2005/0104103 A1* | 5/2005 | Hamamoto et al. | 257/295 |
| 2005/0174854 A1* | 8/2005 | Tsushima et al. | 365/185.29 |
| 2006/0092737 A1* | 5/2006 | Hachino et al. | 365/209 |
| 2009/0103350 A1* | 4/2009 | Kund | 365/148 |
| 2010/0214827 A1* | 8/2010 | Lankhorst et al. | 365/163 |
| 2010/0265749 A1* | 10/2010 | Wang et al. | 365/51 |

OTHER PUBLICATIONS

U.S. Appl. No. 12/767,732, filed Apr. 26, 2010, parent application to this divisional application.

* cited by examiner

*Primary Examiner* — Jason M Crawford

(57) ABSTRACT

An integrated circuit may can include a memory section that stores data in programmable impedance elements arranged at cross points of select lines and sub bit lines, groups of sub bit lines each being connected to a different main bit line, the elements being formed above a substrate surface.

19 Claims, 26 Drawing Sheets

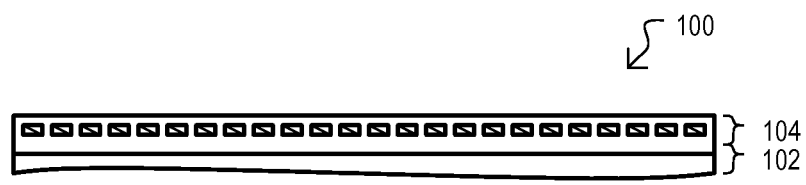
FIG. 1
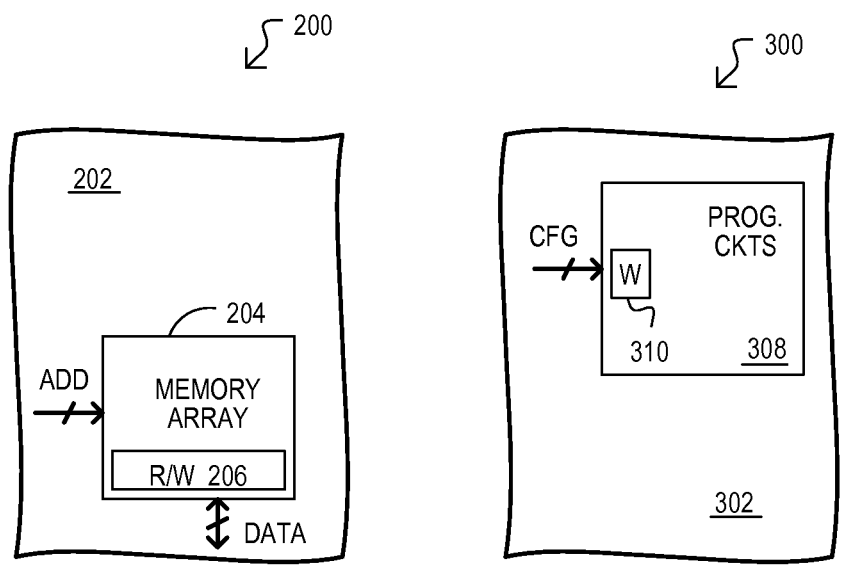
FIG. 2
FIG. 3

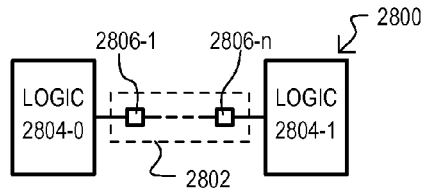
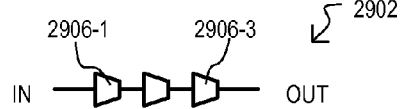
FIG. 28      FIG. 29
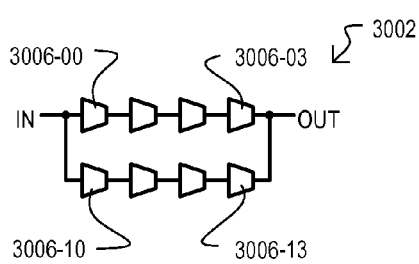
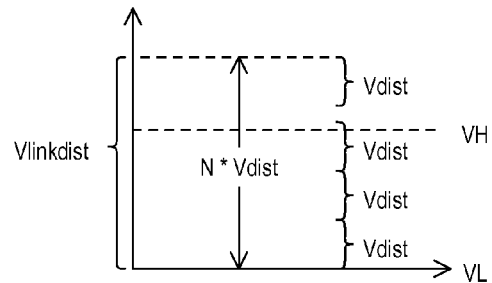
FIG. 30      FIG. 31
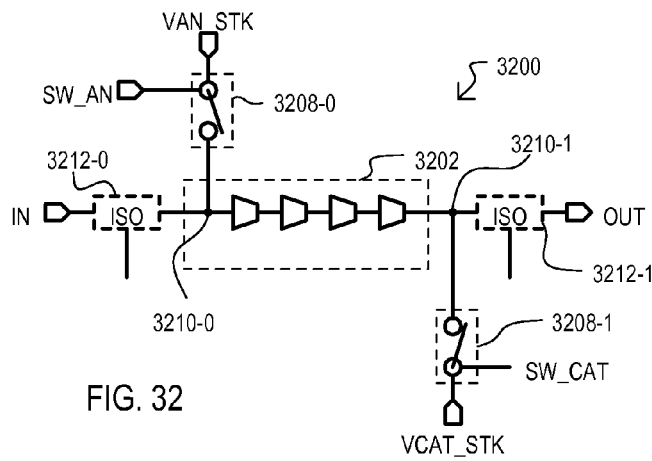
FIG. 32
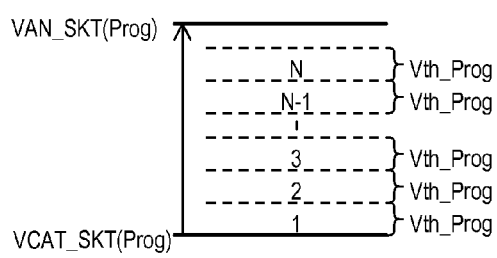
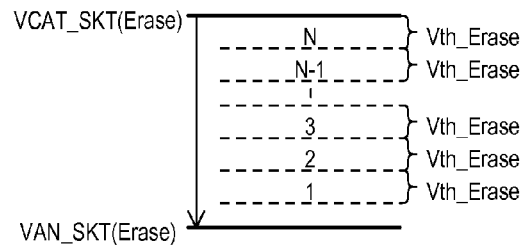
FIG. 33      FIG. 34

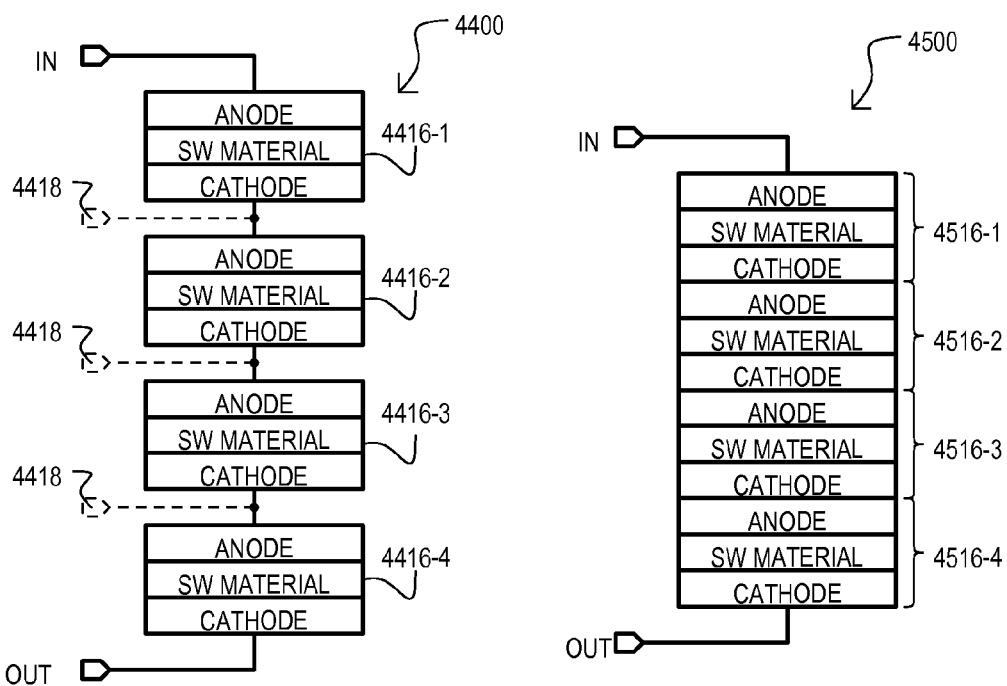
FIG. 44
FIG. 45
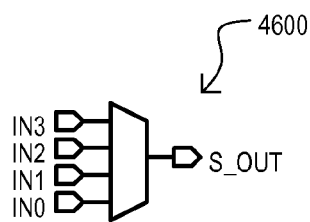
FIG. 46

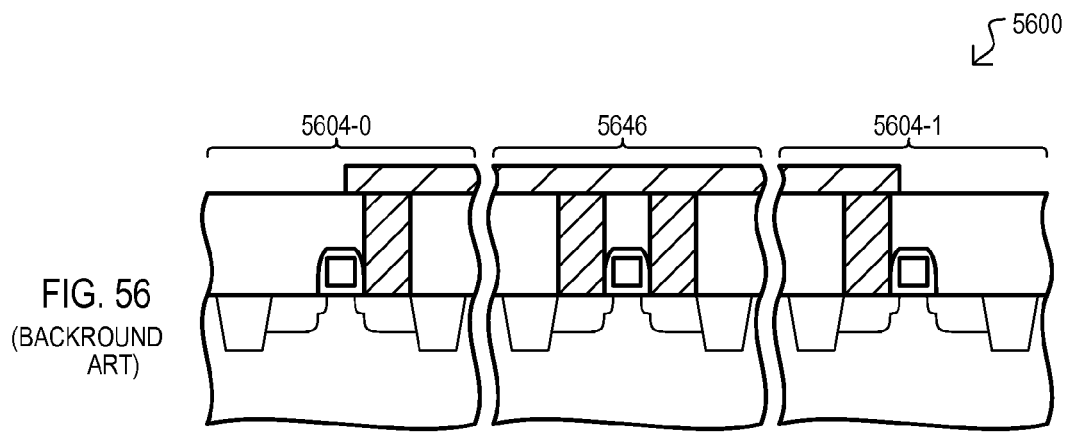
FIG. 56 (BACKGROUND ART)
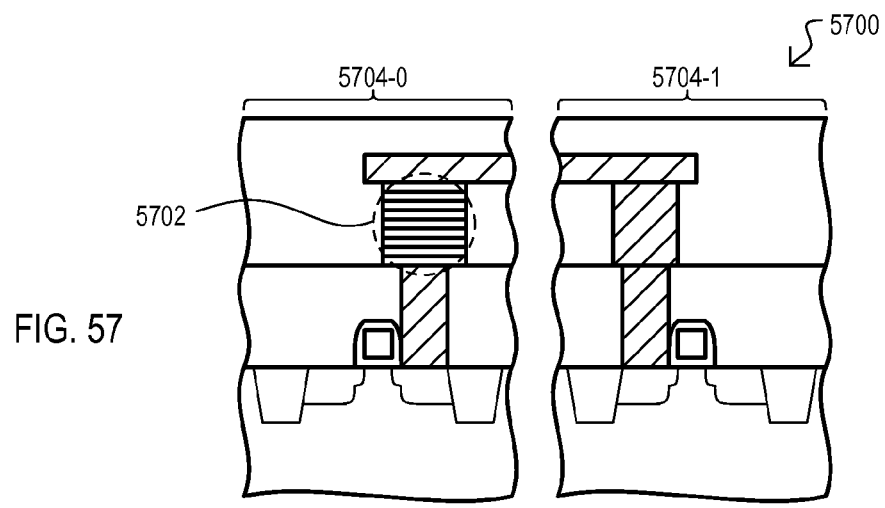
FIG. 57
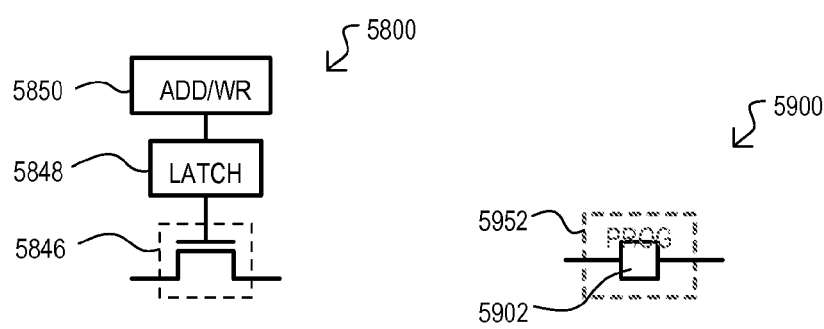
FIG. 58 (BACKGROUND ART)
FIG. 59

PROGRAMMABLE IMPEDANCE ELEMENT CIRCUITS AND METHODS

This application is a divisional of U.S. Pat. No. 8,294,488, Ser. No. 12/767,732, filed on Apr. 26, 2010, which claims the benefit of U.S. Provisional Patent Application Ser. No. 61/172,696, filed on Apr. 24, 2009, the contents all of which are incorporated by reference herein.

TECHNICAL FIELD

The present invention relates generally to integrated circuit devices, and more particularly, to integrated circuit devices having variable impedance elements such as programmable metallization cells (PMCs) or conductive bridging random access memories (CBRAMs).

BRIEF DESCRIPTION OF THE DRAWINGS

FIG. 1 is a side cross sectional view of an integrated circuit device according to an embodiment.

FIG. 2 is top plan view of an integrated circuit device according to an embodiment.

FIG. 3 is top plan view of an integrated circuit device according to another embodiment.

FIGS. 6A and 6B show a program operation for a memory array like that of FIG. 5 according to one embodiment.

FIGS. 7A and 7B show a program operation for a memory array like that of FIG. 5 according to another embodiment.

FIGS. 10A and 10B show a read operation for a memory array like that of FIG. 5 according to one embodiment.

FIGS. 11A and 11B show a read operation for a memory array like that of FIG. 5 according to another embodiment.

FIG. 28 is block schematic diagram of an integrated circuit device according to another embodiment.

FIG. 29 is a schematic diagram of a programmable link that may be included in an embodiment like that of FIG. 28.

FIG. 30 is a schematic diagram of another programmable link that may be included in an embodiment like that of FIG. 28.

FIG. 31 is a diagram showing a resistance to disturb for a programmable link like that of FIG. 29 or 30.

FIG. 32 is a block schematic diagram of a program/erase circuit for a programmable link according to one embodiment.

FIG. 33 shows a program operation of a circuit like that of FIG. 32.

FIG. 34 shows an erase operation of a circuit like that of FIG. 32.

FIG. 44 shows a structure of a programmable link according to one embodiment.

FIG. 45 shows a structure of a programmable link according to another embodiment.

FIG. 46 is a block schematic diagram of a programmable multiplexer (MUX) according to an embodiment.

FIG. 56 is a side cross sectional view of a conventional programmable link structure.

FIG. 57 is a side cross sectional view of a programmable link structure according to an embodiment.

FIG. 58 is a block schematic diagram of a conventional programmable link circuit.

FIG. 59 is a block schematic diagram of a programmable link circuit according to an embodiment.

DETAILED DESCRIPTION

Figure 4:
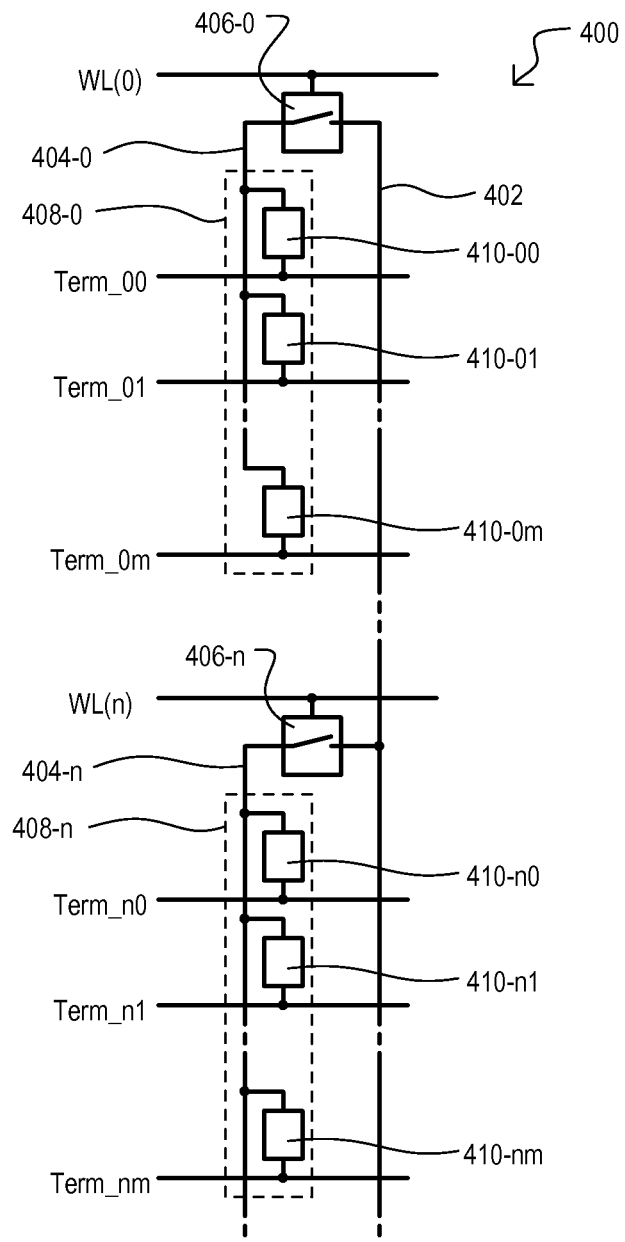
FIG. 4 is a block schematic diagram of a memory array according to an embodiment.

Various embodiments of the present invention will now be described in detail with reference to a number of drawings. The embodiments show circuits and methods of integrated circuit devices having programmable impedance elements, such as programmable metallization cells (PMCs), sometimes referred to as conductive bridging random access memory (CBRAM) cells. Embodiments may include compact memory cell arrays, including write and read circuits for such arrays. In addition or alternatively, embodiments may include programmable circuits, such as programmable logic circuits and/or switches.

Examples of PMCs are shown and described in U.S. Pat. Nos. 6,635,944 and 7,359,236. Particular embodiments may include PMCs formed from such examples, or equivalents.

Referring now to FIG. 1, a portion of an integrated circuit (IC) device according to one embodiment is shown in side cross sectional view and designated by the general reference character 100. An IC device 100 may be conceptualized as including a substrate portion 102 and programmable portion 104 formed over a substrate portion 102. In one embodiment, a substrate portion 102 may include active devices, such as transistors or the like. A substrate portion 102 may include a substantially monocrystalline semiconductor substrate in particular embodiments.

A programmable portion 104 may include programmable impedance elements that may be programmed between at least two different impedances to store data and/or enable IC device to be configured between different modes of operation.

Referring to FIG. 2, a portion of an IC device according to an embodiment is shown in a top plan view and designated by the general reference character 200. The IC device of FIG. 2 may be one implementation of that shown in FIG. 1.

An IC device 200 may include a memory array 204. A memory array 204 may include programmable impedance elements as data storage elements. In response to address values (ADD), data locations may be accessed via data paths (DATA). A memory array 204 may include read and write circuits 206. Read and write circuits 206 may read data values out from memory array 204 and program and erase memory elements to particular impedance values.

In some embodiments, an IC device 200 may have substantially only a storage function, in which case an IC device 200 may be a standalone memory IC device. 200. In other embodiments, a memory array 204 may be an "embedded" memory that supports some other IC device 200 function.

Referring to FIG. 3, a portion of an IC device according to an embodiment is shown in a top plan view and designated by the general reference character 300. The IC device of FIG. 3 may be one implementation of that shown in FIG. 1.

An IC device 300 may include programmable circuits 308. Programmable circuits 308 may include circuits that may be configured between different functions according to states of programmable impedance elements. In the particular embodiment shown, in response to configuration data CFG, programmable impedance elements may be programmed or erased between different states by write circuit 310, to thereby configure programmable circuits into a particular function.

Referring now to FIG. 4, a memory architecture according to one embodiment is shown in schematic diagram and designated by the general reference character 400. A memory architecture 400 may be included in a memory array like that shown as 204 in FIG. 2.

A memory architecture 400 may includes a main bit line (MBL) 402, sub bit lines (subBLs) 404-0 to 404-n, access devices 406-0 to 406-n, and programmable impedance element groups 408-0 to 408-n.

MBL 402 may be connected to subBLs (404-0 to 404-n) by corresponding access devices (406-0 to 406-n). Each subBL (404-0 to 404-n) may be connected to a corresponding element group (408-0 to 408-n). Access devices 406-0 to 406-n may be enabled by corresponding word lines WL(0) to WL(n), to thereby provide a low impedance path between a given subBL and the MBL 402.

Element groups (408-0 to 408-n) may each include "m+4" programmable impedance elements (440-00 to 440-nm). Each element (440-00 to 440-nm) in the same group may have one terminal connected to the corresponding subBL, and another terminal connected to a different terminal line (Term_00 to Term_nm). In one embodiment, elements (440-00 to 440-nm) may be programmable metallization cells (PMCs).

A memory architecture 400 may enable programmable impedance elements to be read, or set to particular data values (and thus store a data value).

In a read operation according to one embodiment, a read potential may be applied to MBL 402, and to a selected terminal line (Term_00 to Term_nm). A selected word line (WL(0) to WL(n)) may be activated, thus applying the read potential across a selected element (440-00 to 440-nm). According to such a read potential, an impedance of the selected element may be detected. Alternatively, in a read operation according to another embodiment, a read current may be supplied to MBL 402 or a selected terminal line (Term_00 to Term_nm). A selected word line (WL(0) to WL(n)) may be activated, thus completing a current path through a selected element (440-00 to 440-nm). According to such a read current, an impedance of the selected element may be detected.

In particular embodiments, data setting operations (e.g., program and/or erase operations) may occur in a similar fashion as a read operation. To set a data value in a selected element, a write (e.g., program or erase) potential may be applied across MBL 402 and a selected terminal line (Term_00 to Term_nm). A selected word line (WL(0) to WL(n)) may be activated, thus applying the write potential across a selected element (440-00 to 440-nm). In response to such a write potential, an impedance of an element may be set to a high impedance or a low impedance. In an alternate embodiment, a write current may be supplied to MBL 402 or a selected terminal line (Term_00 to Term_nm). A selected word line (WL(0) to WL(n)) may be activated, thus completing a current path through a selected element (440-00 to 440-nm). According to such a write current, an impedance of the selected element may be changed.

In this way, an integrated circuit device may include a memory array having an architecture in which sub bit lines may each be connected to a group of programmable impedance elements, and groups of sub bit lines may be connected to main bit lines.

Figure 5:
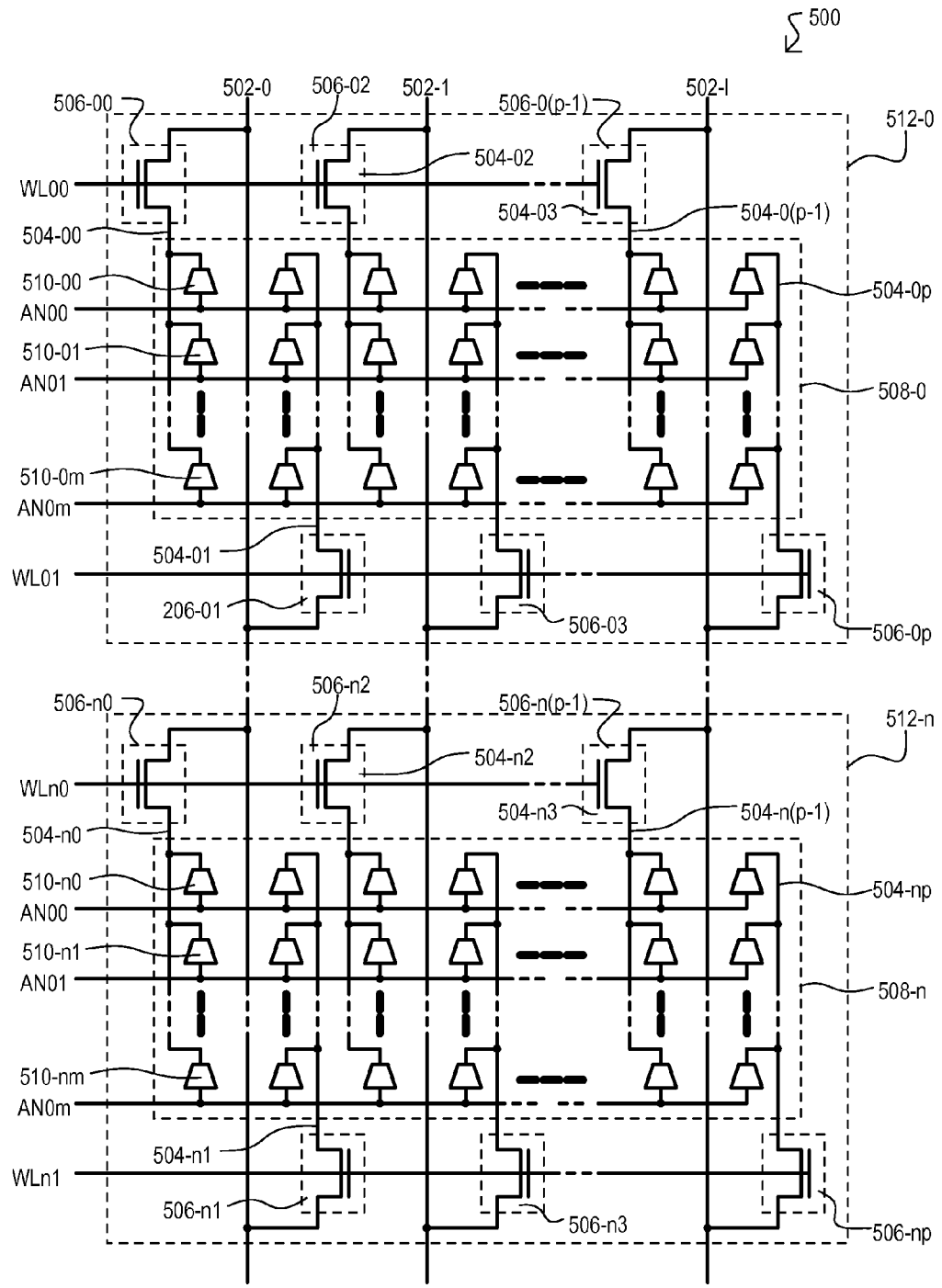
FIG. 5 is a schematic diagram of a memory array according to another embodiment.

Referring now to FIG. 5, a memory architecture according to another embodiment is shown in a schematic diagram and designated by the general reference character 500. A memory architecture 500 may be included in a memory array like that shown as 204 in FIG. 2.

A memory architecture 500 may include a number of memory blocks 512-0 to 512-n. Memory blocks (512-0 to 512-n) may share MBLs 502-0 to 502-l.

Within each memory block (512-0 to 512-n) a MBL (502-0 to 502-l) may be connected to one of two subBL (504-00 to 504-np) by corresponding access devices (506-00 to 506-np). In the example shown, access devices may be n-channel insulated gate field effect transistors (referred to herein as MOS transistors, but not implying any particular gate insulator material).

Programmable impedance elements of a same group (one group shown as 510-00 to 510-0m) may have first terminals commonly connected to a corresponding subBL (504-00 to 504-np) and second terminals connected to different terminal lines (AN00 to ANnm). In the example shown, elements may be PMCs having cathodes connected to a subBL and anodes connected to an anode line (AN00 to ANnm).

In such an arrangement, each memory block 512-0 to 512-n may include a (m+1)×(p+1) array of PMC elements, connected in one direction (vertical in the figure) to subBLs, and in another direction (horizontal in the figure) to anode lines. Such an arrangement may allow for a high density array, as PMC elements of the array may be formed at crossing connections between subBLs and anode lines. At the same time, groups of PMCs may be selectable based on the operation of access devices (506-00 to 506-np).

In this way, a memory architecture may include memory blocks having programmable impedance elements formed at cross point locations of conductive lines, with groups of elements being connected to sub bit lines, and groups of sub bit lines being commonly connected to main bit lines.

Having described a memory architecture in FIG. 5, various operations for such an architecture will now be described.

Figure 6B:
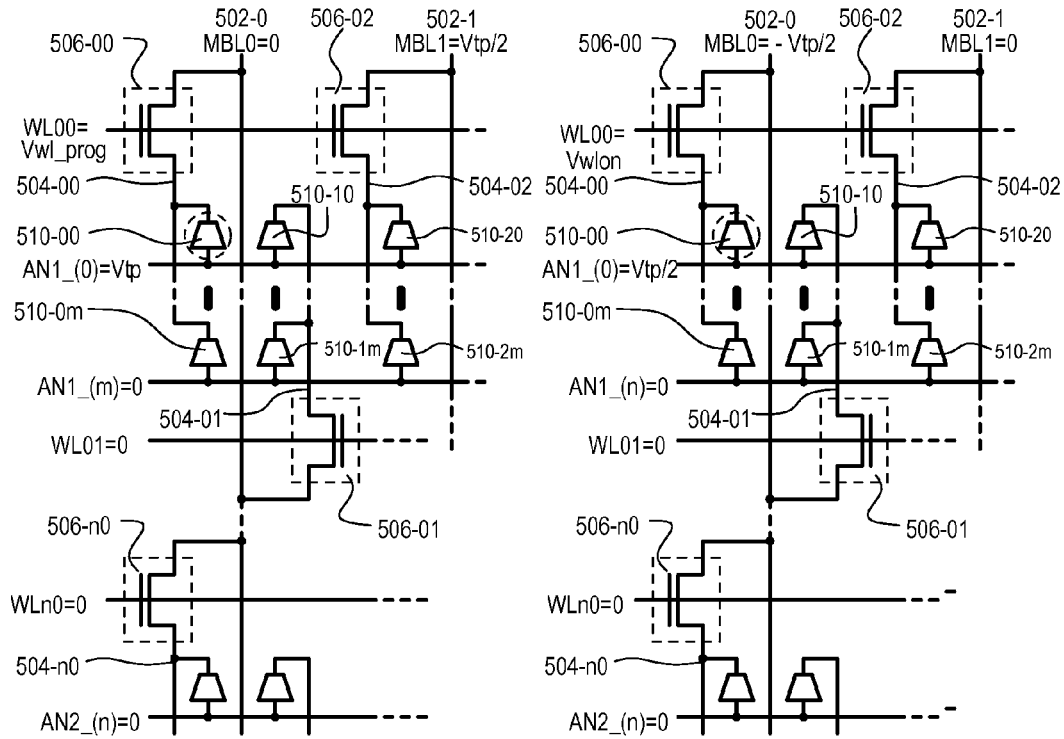
Figure 6B:
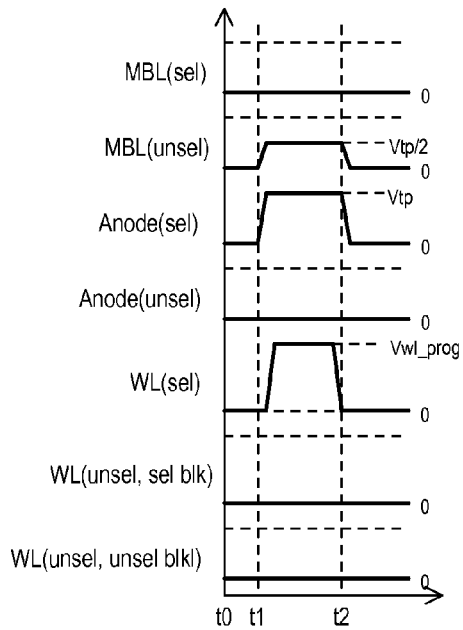

Referring to FIGS. 6A and 6B, a programming operation is shown for an architecture like that of FIG. 5 according to one embodiment. FIG. 6A shows a portion of the architecture of FIG. 5, and FIG. 6B is a timing diagram showing waveforms of signals corresponding to the programming operation.

In the embodiment shown, it is assumed that PMC 510-00 and PMC 510-10 are being programmed to a low impedance state, while PMC 510-20 is not being programmed. It is also assumed that the application of a program threshold voltage (Vtp) across terminals of a PMC (positive from anode to cathode) can result in the PMC being programmed to a low impedance state.

Prior to a program operation, at about time t0, a selected main bit line (in this case MBL0), unselected main bit line (MBL1), selected anode line AN1_(0), unselected anode lines (AN1_(n), AN2_(n)), selected word line WL00, unselected word lines of a selected block (e.g., WL01) and unselected word lines of an unselected block (e.g., WLn0) may all be at a low level (e.g., zero volts).

At about time t1, selected MBL0 is zero volts. Unselected MBL1 may be driven to a voltage Vtp/2. Selected anode line AN1_(0) may be driven to a voltage Vtp. Unselected anode lines (AN1_(n), AN2_(n)) may be driven to a low level. With such voltage levels in place, a selected word line WL00 may be driven to a select program voltage Vwl_prog, while unselected word lines (WL01, WLn0) remain low.

In such an arrangement, a program voltage Vtp is connected across the selected PMC, while voltages across other unselected PMCs are less than Vtp (i.e., not sufficient to program such PMCs). This is described in the following examples.

Selected PMC 510-00 may have a voltage Vtp applied to its anode via line AN1_(0), while 0 volt is applied to its cathode via selected main bit line MBL 502-0. Thus, the PMC may be programmed.

Unselected PMC 510-0m, connected to the same subBL as the programmed PMC 510-00, may have 0 volts applied to its anode via unselected anode line AN1_(m), while 0 volts is applied to its cathode via selected main bit line MBL0 502-0. Accordingly, substantially no potential is presented across the PMC, thus it is not programmed.

Unselected PMC 510-20 connected to an unselected MBL 502-1, may have Vtp applied to its anode via selected anode line AN1_(0), while Vtp/2 is applied to its cathode. Accordingly, a potential of Vtp/2 may be presented across the PMC, which may be too small to program the PMC.

Unselected PMC 510-2m connected to unselected anode line AN1_(m) and unselected bit line MBL1, may have 0 volts applied to its anode via unselected anode line AN1_(m), while Vtp/2 is applied to its cathode. Accordingly, a potential of Vtp/2 may be presented across the PMC, which may not be large enough to program the PMC.

Unselected PMC 510-10 connected to selected anode line AN1_(0) and unselected subBL 504-01, may have Vtp applied to its anode via selected anode line AN1_(0). However, word line WL01 is low, thus the PMC's cathode is left floating (high impedance). Accordingly, the PMC may not be programmed.

At about time t2, the various signals return to unselected states.

Figure 7B:
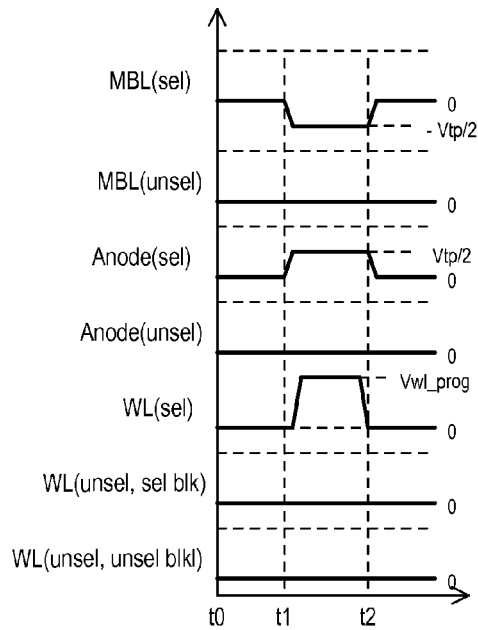

Referring to FIGS. 7A and 7B, a programming operation is shown for an architecture like that of FIG. 5 according to another embodiment. FIG. 7A shows a portion of the architecture of FIG. 5, and FIG. 7B is a timing diagram showing waveforms of signals corresponding to the programming operation.

In the embodiment shown by FIGS. 7A and 7B, it is assumed that PMC 510-00 is being programmed to a low impedance state, while PMC 510-02 is not being programmed.

Prior to a program operation, at about time t0, various potentials may be at the same unselect levels as in FIG. 6B.

At about time t1, selected MBL0 falls to −Vtp/2. Unselected MBL1 may be low. Selected anode line (AN1_(0)) may be driven to a voltage Vtp/2. Unselected anode lines (AN1_(n), AN2_(n)) may be driven to a low level. With such voltage levels in place, a selected word line WL00 may be driven to an "on" voltage Vwl_on, while unselected word lines (WL01, WLn0) remain low.

In such an arrangement, a program voltage Vtp is connected across a selected PMC, while voltages across other unselected PMCs are not sufficient to program such PMCs. This is described in the following examples.

Selected PMC 510-00 may have a voltage Vtp/2 is applied to its anode via line AN1_(0), while −Vtp/2 is applied to its cathode via MBL0. Thus the PMC may be programmed.

Unselected PMC 510-0m, connected to the same subBL as the programmed PMC 510-00, may have 0 volts applied to its anode via unselected anode line AN1_(m), while −Vtp/2 volts is applied to its cathode from MBL0. Accordingly, the potential presented across the PMC may not be sufficient to program it.

Unselected PMC 510-20 connected to an unselected MBL 502-1, may have Vtp/2 applied to its anode via selected anode line AN1_(0), while 0 volts is applied to its cathode. Accordingly, the potential across the PMC may not be large enough to program the PMC.

Unselected PMC 510-2m connected to unselected anode line AN1_(m), may have 0 volts applied to its anode via unselected anode line AN1_(m), while 0 volts is applied to its cathode. Accordingly, the PMC may not be programmed.

Unselected PMC 510-10 connected to selected anode line AN1_(m), may have Vtp applied to its anode via selected anode line AN1_(0). However, word line WL01 is low, thus the PMC's cathode is left floating (high impedance). Accordingly, the PMC may not be programmed.

At about time t2, the various potentials return to unselected states.

In this way, programmable impedance elements may be selected and de-selected for programming operations.

Figure 8A:
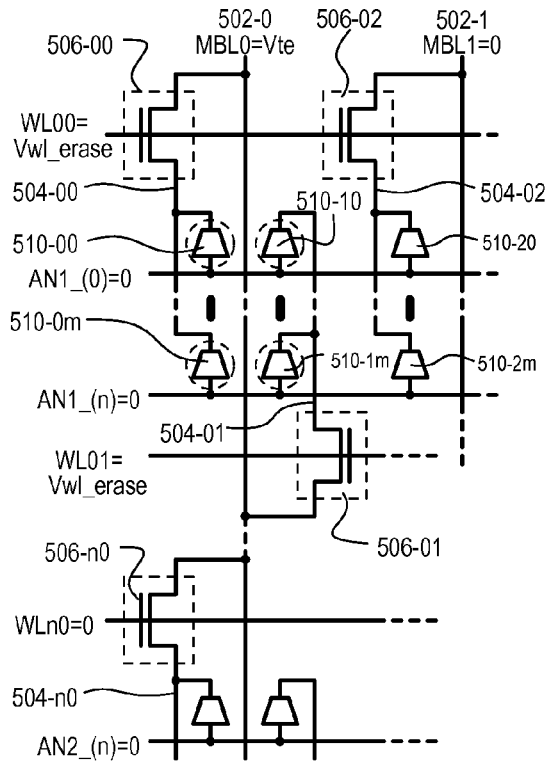
FIGS. 8A and 8B show an erase operation for a memory array like that of FIG. 5 according to one embodiment.
Figure 8B:
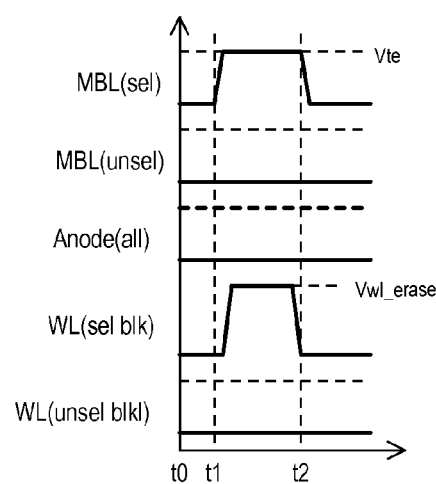

Referring to FIGS. 8A and 8B, an erase operation is shown for an architecture like that of FIG. 5 according to one embodiment. FIG. 8A shows a portion of the architecture of FIG. 5, and FIG. 8B is a timing diagram showing waveforms of signals corresponding to the programming operation.

In the embodiment shown, it is assumed that a group of PMCs 510-00 to 510-1m are erased together to a high impedance state, while the remaining PMCs are not erased. It is also assumed that the application of an erase threshold voltage (Vte) across terminals of a PMC (negative from anode to cathode) can result in the PMC being erased to a high impedance state.

Prior to an erase operation, at about time t0, various signals for an erase operation may be at unselected levels, as described for FIG. 6B at time t0.

At about time t1, selected MBL0 may rise to an erase voltage. Unselected MBL1 may be driven to a low voltage (e.g., 0 volts). Anode lines (AN1_(0) to AN_2(n)) may remain low. With such voltage levels in place, word lines of a selected block (WL00 and WL01) may be driven to a select erase voltage Vwl_erase, while word line of an unselected block (WLn0) may remain low.

In such an arrangement, an erase voltage Vte is connected across PMCs of a same MBL and block, resulting in such PMCs being erased. At the same time, voltages across other unselected PMCs are not sufficient to erase such PMCs. Particular PMCs in the erase operation are described below.

Selected PMCs 510-00 to 510-1 may have a voltage Vte applied to their cathodes via MBL0 and corresponding select devices 506-00 and 506-01, while 0 volts is applied to their anodes, via anode lines AN1_(0) to AN1_(n). Thus, this group of PMCs may be erased.

Unselected PMCs 510-20 and 510-2m may have 0 volts applied to their anodes via anode lines AN1_(0) to AN1_(m), while 0 volts is applied to their cathodes via unselected MBL1. Accordingly, the PMCs may not be erased.

At about time t2, the various potentials return to unselected states.

In this way, PMCs connected to a same MBL residing in the same block may be erased as a group.

Figure 9A:
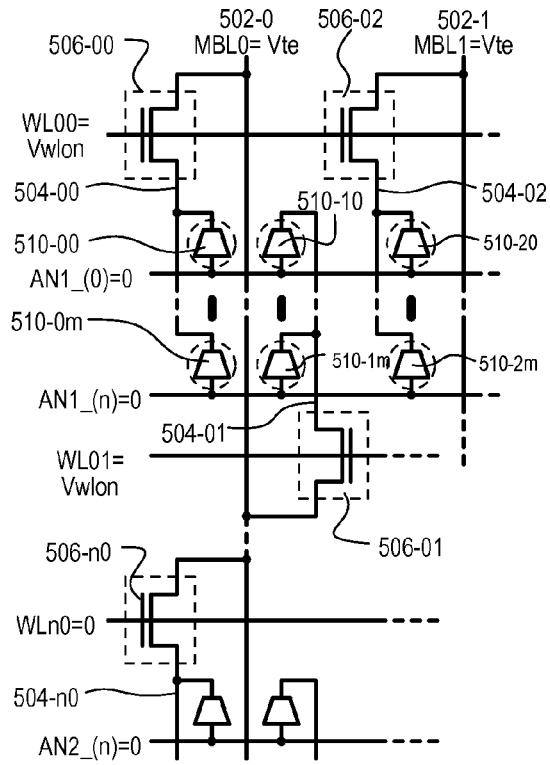
FIGS. 9A and 9B show an erase operation for a memory array like that of FIG. 5 according to another embodiment.
Figure 9B:
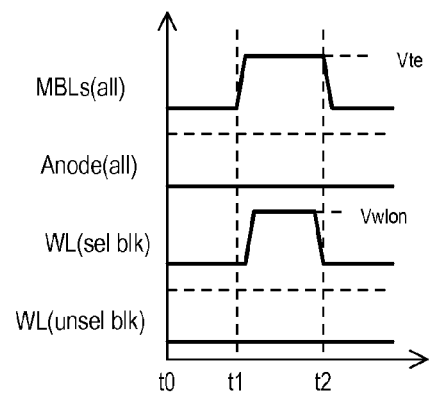

Referring to FIGS. 9A and 9B, an erase operation is shown for an architecture like that of FIG. 5 according to another embodiment. FIG. 9A shows a portion of the architecture of FIG. 5, and FIG. 9B is a timing diagram showing waveforms of signals corresponding to the programming operation.

FIGS. 9A and 9B show an erase operation similar to that of FIGS. 8A and 8B. However unlike FIGS. 8A and 8B, a voltage Vte is applied to all main bit lines (502-0/1). Consequently, Vte is applied across all PMCs of memory block 512-0, resulting in a block erasing of such PMCs.

In this way, PMCs of an entire block may be erased together.

Figure 10B:
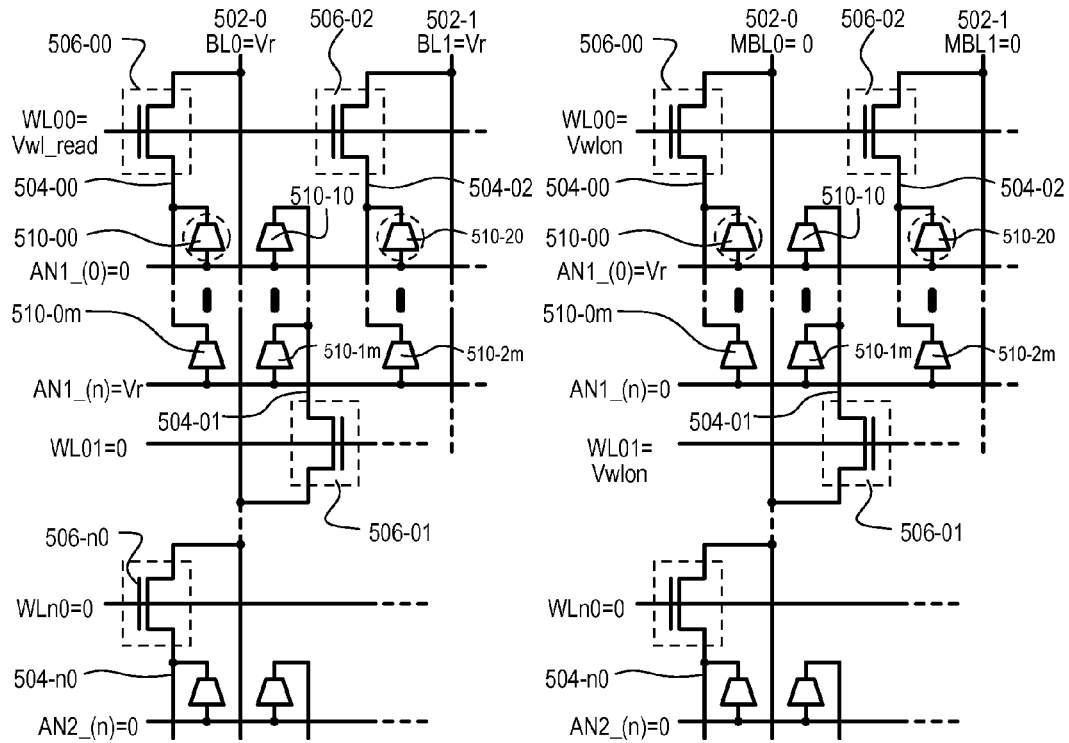
Figure 10B:
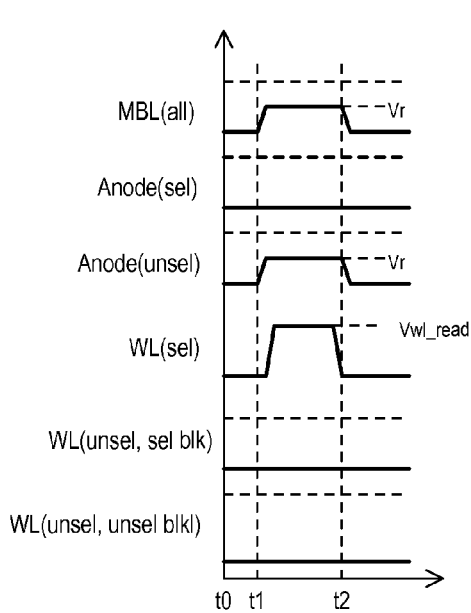

Referring to FIGS. 10A and 10B, a read operation is shown for an architecture like that of FIG. 5 according to one embodiment. FIG. 10A shows a portion of the architecture of FIG. 5, and FIG. 10B is a timing diagram showing waveforms of signals corresponding to the programming operation.

In the embodiment shown, it is assumed that data from PMCs of even subBLs connected to anode line AN_(0) are read in parallel.

Prior to a read operation, at about time t0, the various signals may be at unselected levels, like those shown at time t0 in FIG. 6B.

At about time t1, main bit lines (MBL0 and MBL1) may rise to a read voltage Vr. A selected anode lines (AN1_(0)) may be driven low, while unselected anode lines (e.g., AN1_(n), AN2_(n)) may be driven to Vr. With such voltage levels in place, a selected word line (WL00) may be driven to a select read voltage Vwl_read, while unselected word lines (WL01, WLn0) remain low.

In such an arrangement, a read voltage Vr is applied to PMCs connected to even subBLs of a block. Such a voltage may generate a read current that may determine an impedance of corresponding PMCs.

It is understood that PMCs connected to odd subBLs could be read by activation of word line WL01 in place of WL00.

Figure 11B:
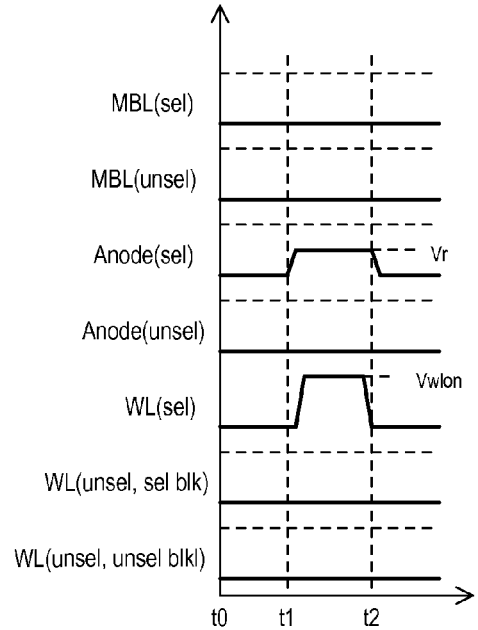

Referring to FIGS. 11A and 11B, a read operation is shown for an architecture like that of FIG. 5 according to another embodiment. FIG. 11A shows a portion of the architecture of FIG. 5, and FIG. 11B is a timing diagram showing waveforms of signals corresponding to the programming operation.

FIGS. 11A and 11B show an operation similar to that of FIGS. 10A and 10B, however, a voltage Vr is applied to a selected anode AN1_(0), while main bit lines (MBL0/1) are low. Thus, a read current may flow in the opposite direction to that of FIGS. 10A and 10B.

In this way, data values stored by programmable impedance elements may be read out from a memory array.

Figure 12:
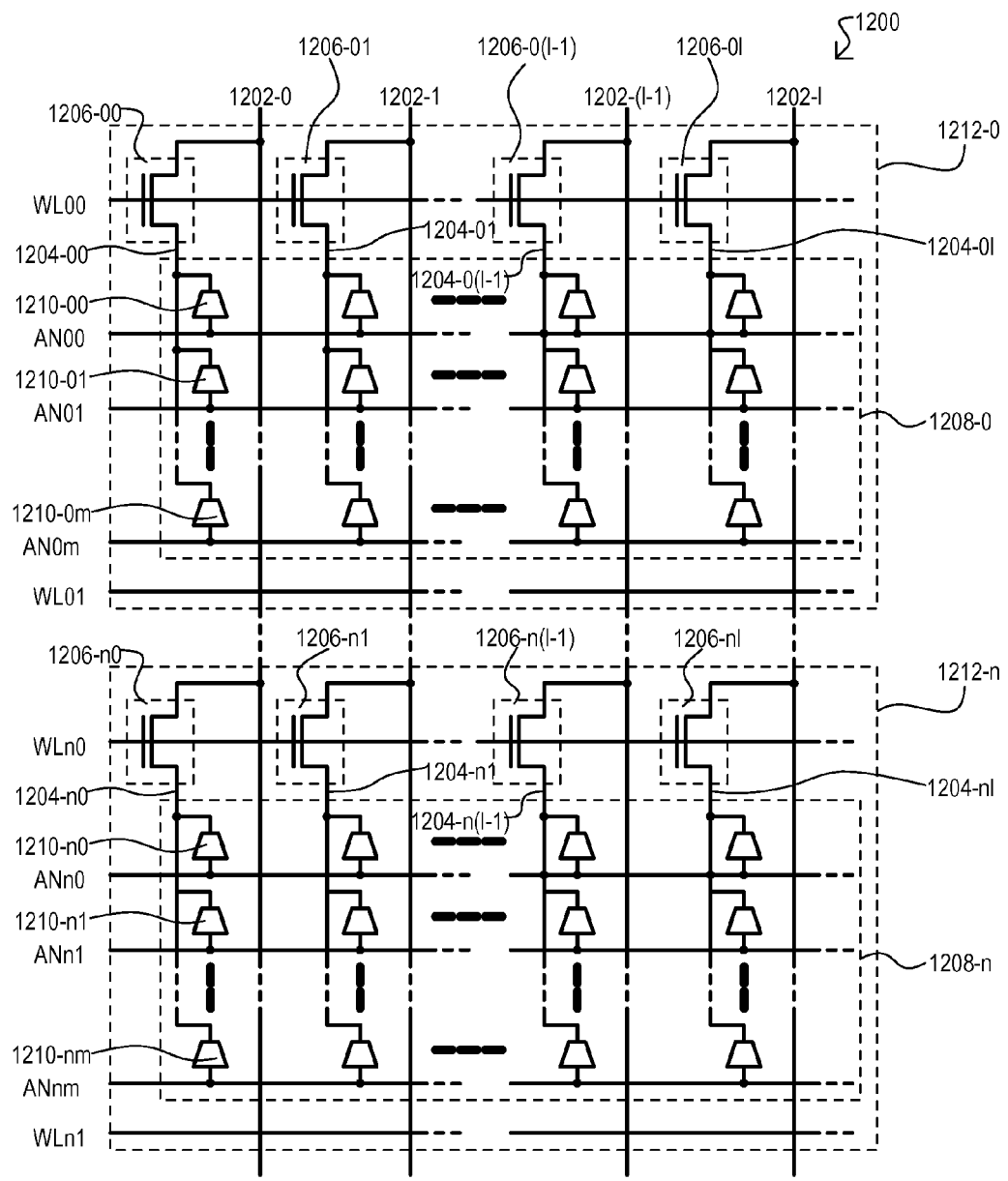
FIG. 12 is a schematic diagram of a memory array according to a further embodiment.

Referring now to FIG. 12, a memory architecture according to a further embodiment is shown in a schematic diagram and designated by the general reference character 1200. A memory architecture 1200 may be included in a memory array like that shown as 204 in FIG. 2.

As in the embodiment shown in FIG. 5, a memory architecture 1200 may include memory blocks 1212-0 to 1212-n. Memory blocks (1212-0 to 1212-n) may share MBLs 1202-0 to 1202-l.

Memory architecture 1200 may have a construction like that shown as 500 in FIG. 5. However, unlike FIG. 5, within each memory block (1212-0 to 1212-n), each MBL (MBLs 1202-0 to 1202-l) may be connected to one subBL (1204-00 to 1204-NL) by operation of a corresponding access device (1206-00 to 1206-nl).

Figure 13:
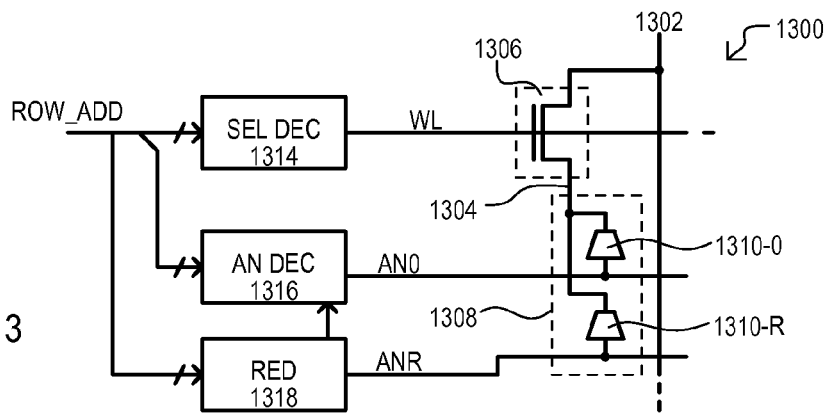
FIG. 13 is a block schematic diagram of a redundancy circuit according to an embodiment.

Referring now to FIG. 13, a memory architecture according to yet another embodiment is shown in a block schematic diagram and designated by the general reference character 1300. An architecture 1300 may provide redundancy by including one or more redundant programmable impedance elements in a group of elements accessed by a common access device.

Memory architecture 1300 shows MBL 1302, subBL 1304, access device 1306, and programmable impedance element group 1308. In the particular example shown, element group 1308 includes two PMCs 1310-0 and 1310-R.

Architecture 1300 also includes a select decoder 1314, an anode decoder 1345 and a redundancy circuit 1318. A select decoder 1314 may receive a portion of an address value (ROW_ADD), and in response, activate a word line WL. An anode decoder 1345 may receive a portion of an address value (ROW_ADD), and in response may activate an anode line AN0. A redundancy circuit 1318 may receive address value (ROW_ADD), and if such an address matches a predetermined address, deactivate anode decoder 1345, and activate a redundant anode line ANR.

In the architecture shown, PMC 1310-R may be a redundant PMC to replace PMC 1310-0 in the event it is defective. In such an arrangement, 100% redundancy may be provided in a memory architecture.

In other embodiments, an element group 1308 may include more than two programmable impedance elements, with one or more such elements being redundant elements.

In this way, a memory architecture having decoded anode or cathodes lines in a PMC array may provide redundancy capabilities.

Figure 14:
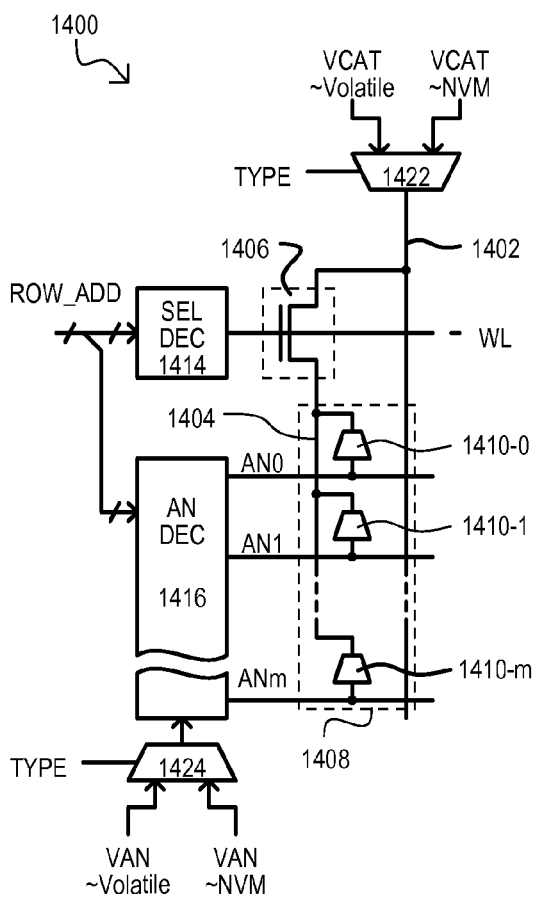
FIG. 14 is a block schematic diagram of a variable write circuit according to an embodiment.

Referring now to FIG. 14, a memory architecture according to another embodiment is shown in a block schematic diagram and designated by the general reference character 1400. A memory architecture 1400 may enable programmable impedance elements of a same group to function differently.

In one embodiment, program and/or erase operations may vary between different types of PMCs. More particularly, one PMC of a same sub bit line group may be programmed/erased to operate with a shorter data retention time than other PMCs of the same group.

A memory architecture 1400 may include MBL 1402, subBL 1404, access device 1406, and programmable impedance element group 1408. In the particular example shown, element group 1408 includes m+1 PMCs 1410-0 and 1410-m.

Architecture 1400 also includes a select decoder 1414, an anode decoder 1445, a cathode voltage MUX 1422, and an anode voltage MUX 1424. A select decoder 1414 may receive a portion of an address value (ROW_ADD), and in response, activate a word line WL. An anode decoder 1445 may receive a portion of an address value (ROW_ADD), and in response may activate one of anode lines AN0 to ANm.

A cathode voltage MUX 1422 may apply a particular cathode voltage to selected PMC cathodes via a MBL 1402 and subBL 1404. A cathode voltage may vary depending upon a desired operation of a selected PMC. In the embodiment shown, two voltage sources are shown VCAT~Volatile and VCAT~NVM. A voltage source VCAT~Volatile may provide a voltage that results in an accessed PMC operating with a relatively short data retention time. A voltage source VACT~NVM may provide a voltage that results in an accessed PMC operating with a relatively long data retention time. Such voltage sources may vary according to operation (e.g., program or erase). Further, to induce such differences in PMC response, such voltages may vary in magnitude, pulse duration, or pulse number, as but a few examples.

An anode voltage MUX 1424 may apply a particular anode voltage to selected PMC anodes via anode decoder 1445. Like cathode voltage MUX 1422, an anode voltage may vary according to how a PMC is to operate. In the embodiment shown, two voltage sources are provided: VAN~Volatile and VAN~NVM. A voltage source VAN~Volatile may provide a voltage that results in an accessed PMC operating with a relatively short data retention time. A voltage source VAN~NVM may provide a voltage that results in an accessed PMC operating with a relatively long data retention time. Such voltage source may vary according to operation (e.g., program or erase). Further, to induce such differences in PMC response such voltages may vary in magnitude, pulse duration, or pulse number, as but a few examples.

In this way, a memory architecture having groups of programmable impedance elements connected to a same sub bit line may selectively operate elements of a same group in a different manner.

Figure 15:
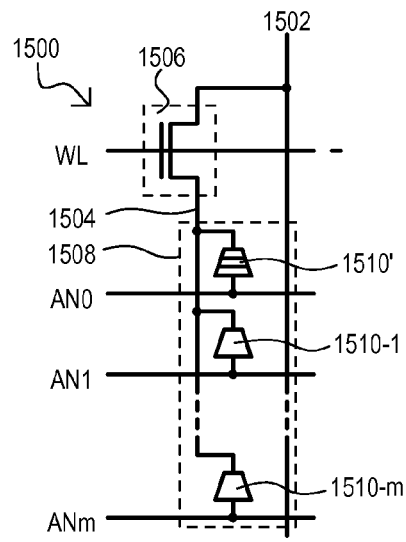
FIG. 15 is a block schematic diagram of a memory array according to another embodiment.

Referring now to FIG. 15, a memory architecture according to another embodiment is shown in a block schematic diagram and designated by the general reference character 1500. A memory architecture 1500 may include groups of programmable impedance elements, in which one or more programmable impedance elements may have a different structure than others of the same group.

The memory architecture 1500 includes MBL 1502, subBL 1504, access device 1506, and programmable impedance element group 1508. In the particular example shown, element group 1508 includes a first type PMC 1510' and "m" PMCs of a second type (1510-1 to 1510-m).

First type PMC 1510' may have a different structure than PMCs of the second type (1510-1 to 1510-m). Such structural differences may result in different programming and/or erase characteristics.

Figure 16A:
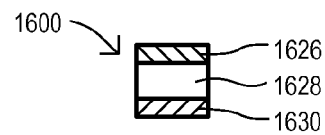
FIGS. 16A to 16C show programmable impedance elements that may be included in an embodiment like that of FIG. 15.
Figure 16B:
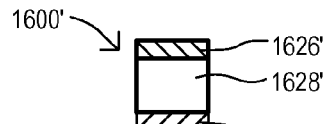
Figure 16C:
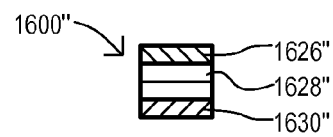

Referring now to FIGS. 16A to 16C, different PMC structures are represented in side cross sectional views. Such different PMC structures may be included in an embodiment like that of FIG. 15.

FIG. 16A shows a first type PMC 1600 having an anode layer 1626, a switching material 1628, and a cathode layer 1630.

FIG. 16B shows a PMC 1600' having an anode layer 1626', a switching material 1628', and a cathode layer 1630'. A switching material 1626' may differ in thickness from that shown as 1626 of FIG. 16A. Alternatively, a switching material 1626' may have a different composition than that shown as 1626 of FIG. 16A.

FIG. 16C shows a PMC 1600" having an anode layer 1626", a switching material 1628", and a cathode layer 1630". A switching material 1626" may differ from that shown as 1626 of FIG. 16A, in that it may include one or more intermediate layers that change the programming/erase characteristics as compared to the embodiment of FIG. 16A.

In this way, a memory architecture having groups of programmable impedance elements connected to a same sub bit line, may include elements having different structures in the same group.

Referring now to FIGS. 17A to 17E, the fabrication of an integrated circuit according to an embodiment. FIGS. 17A to 17E may be one implementation that shown in FIG. 5. FIGS. 17A to 17E are a series of top down views showing an integrated circuit substrate after various layers/features are formed.

Figure 17A:
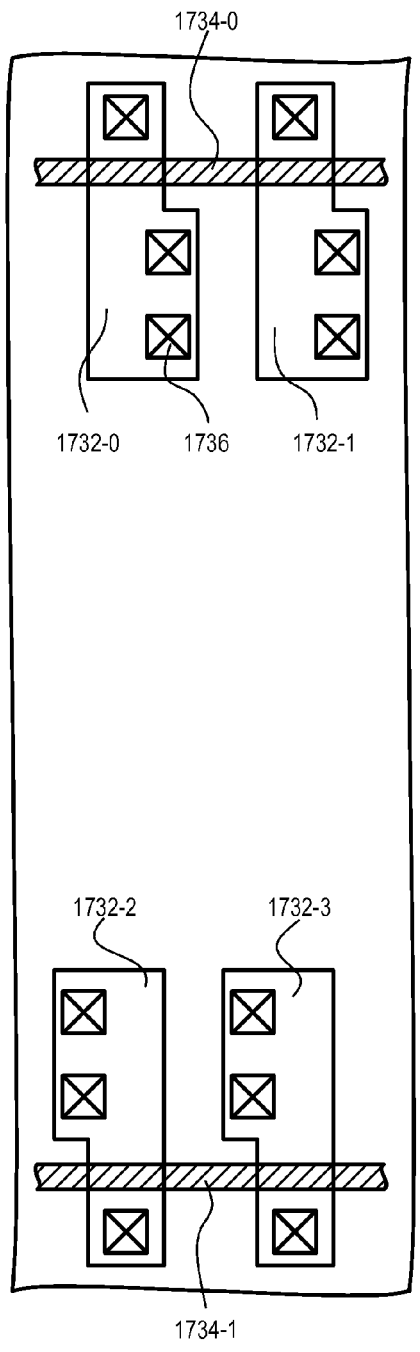
FIGS. 17A to 17E are a sequence of top plan views showing a structure and fabrication method of a memory array according to yet another embodiment.

FIG. 17A shows active regions 1732-0 to 1732-3 in which transistors may be formed. Gate structures 1734-0/1 may form transistor gates of four access device, each corresponding to an active region (1732-0 to 1732-3). Contacts (one shown as 1736) may be formed through an insulating layer to sources and drain regions of access devices.

Figure 17B:
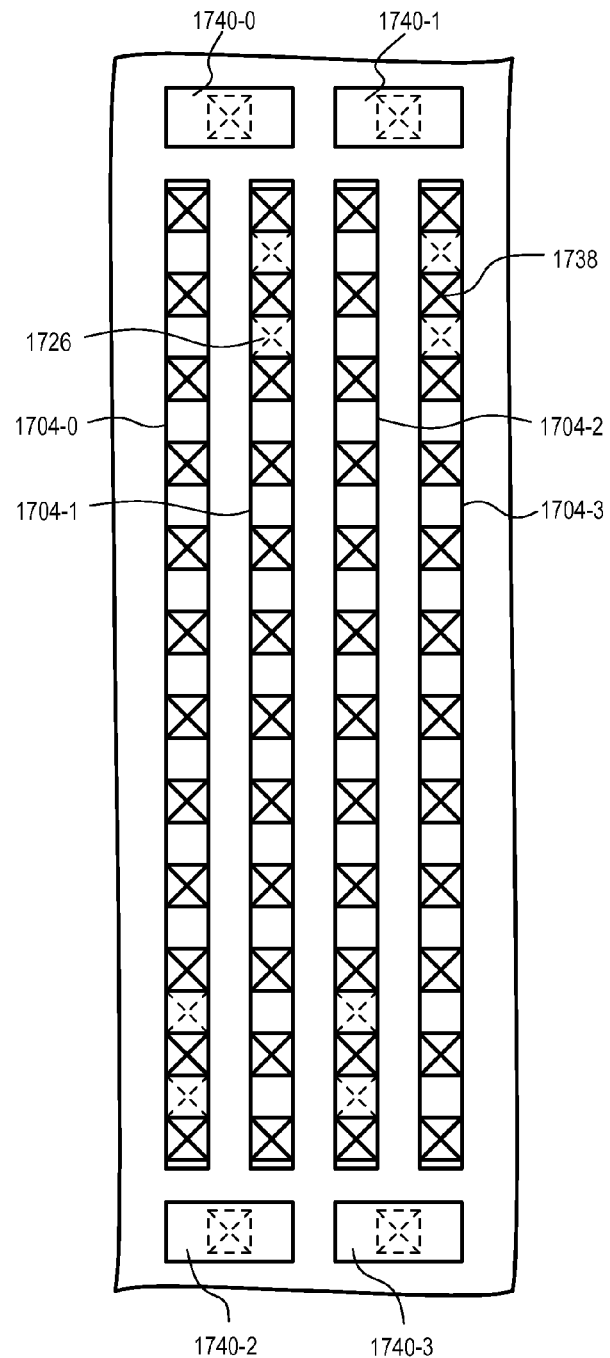

FIG. 17B shows the formation of subBLs 1704-0 to 1704-3, as well as contact pads 1740-0 to 1740-3. Each subBL (1704-0 to 1704-3) may contact an access device source/drain at two contact locations. As shown in FIG. 17B, two subBLs may fit within an access device pitch, to arrive at a compact array. Contact pads (1740-0 to 1740-3) may provide locations for a main bit line (not shown) to contact access devices. SubBLs 1704-0 to 1704-3 and contact pads 1740-0 to 1740-3 may be formed from a first metallization layer. Optionally, PMC contacts 1738 may be opened through an insulating layer to provide locations where PMC cells may contact subBLs (1704-0 to 1704-3). Alternatively, a cathode layer may be formed as a top portion of each subBL.

Figure 17C:
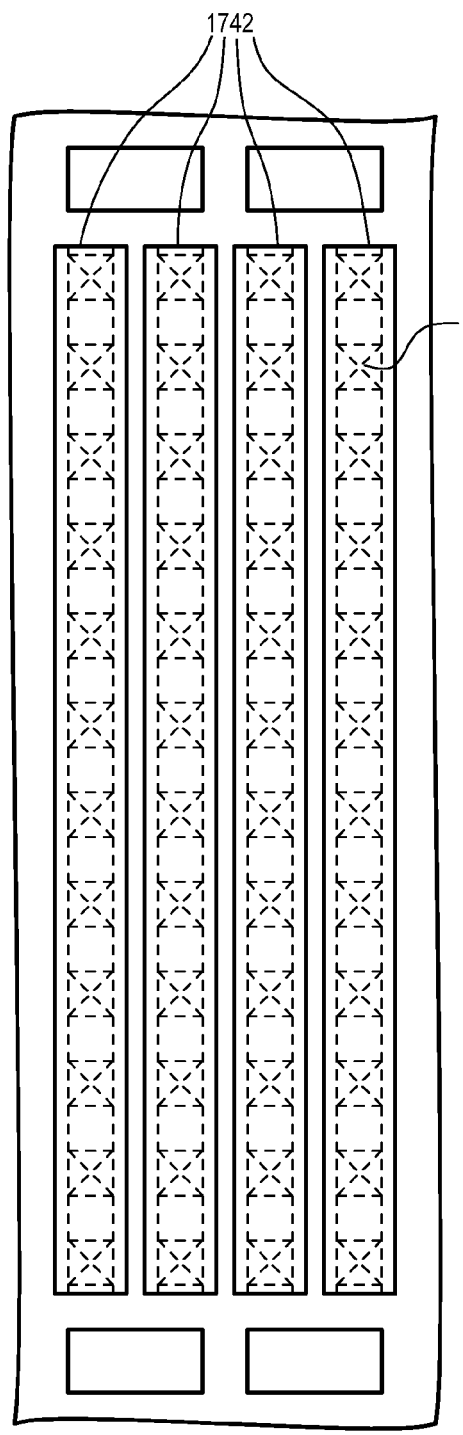

FIG. 17C shows an optional arrangement in which a PMC cathode layer and switching material layer 1742 may be patterned over subBLs, and made to contact subBLs through PMC contacts 1738. As noted previously, in other embodiments a cathode layer (and optionally a switching layer) may be integrated as parts of sub bit lines.

Figure 17D:
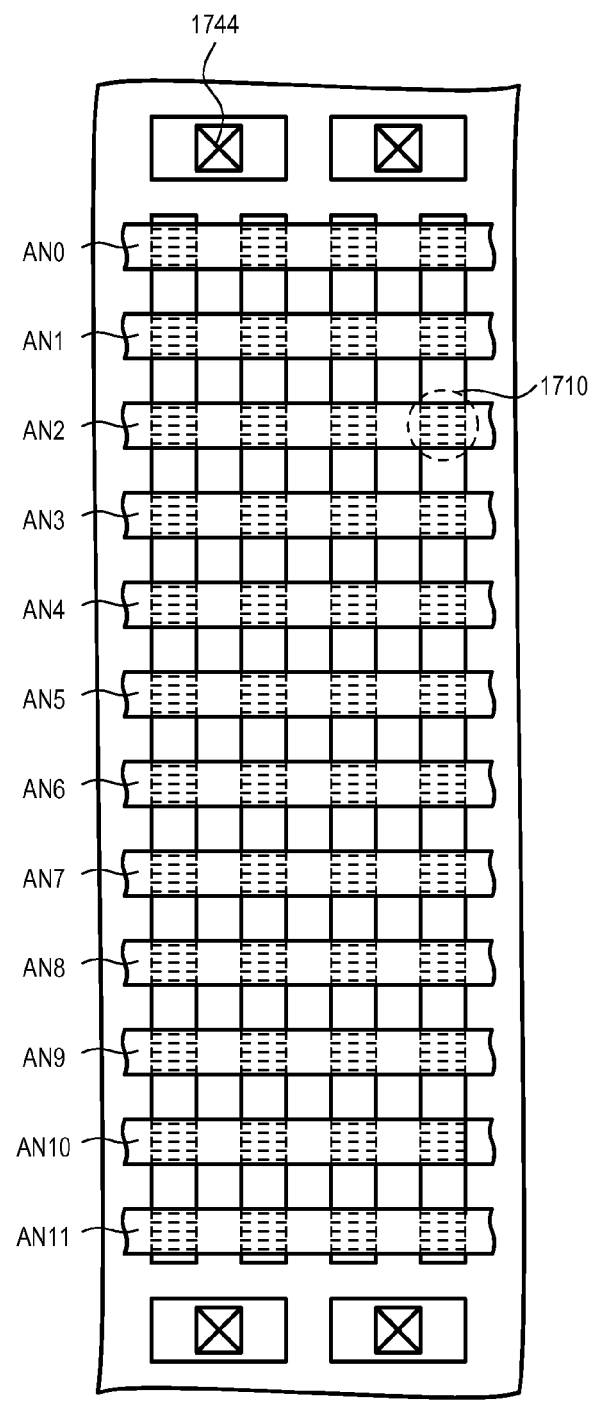

FIG. 17D shows the formation of anode lines (AN0 to AN11) over and perpendicular to subBLs. A resulting structure may create PMCs (one shown as 1710) at cross points of subBLs and anode lines (AN0 to AN11). MBL contacts (one shown as 1744) may be formed through an insulating layer to contact pads 1740-0 to 1740-3.

Figure 17E:
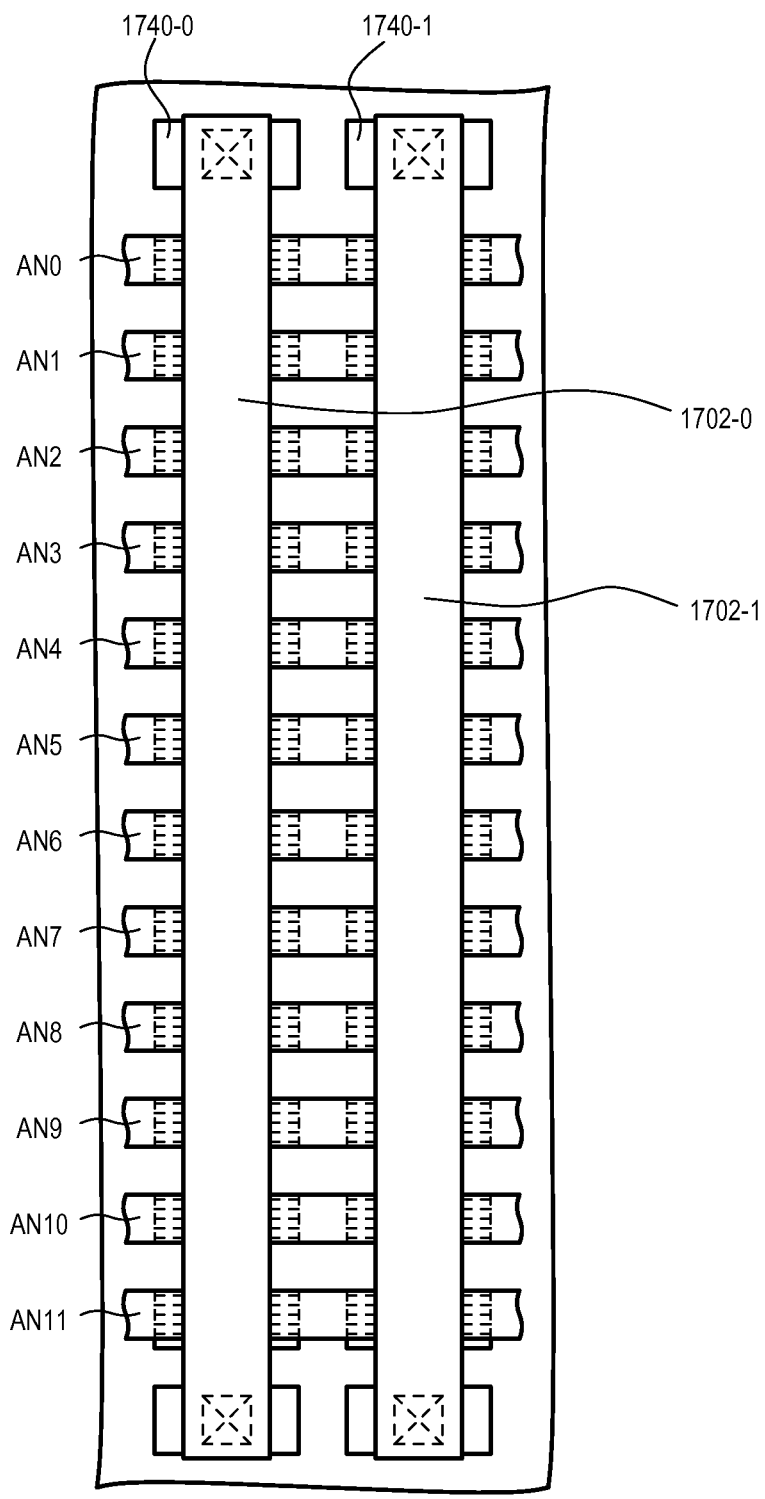

FIG. 17E shows the formation of MBLs 1702-0/1. Such MBLs 1702-0/1 may contact access devices via contact pads 1740-0 to 1740-3.

Having described memory array architectures, particular data write circuits that may be utilized in such architectures will now be described.

Figure 18:
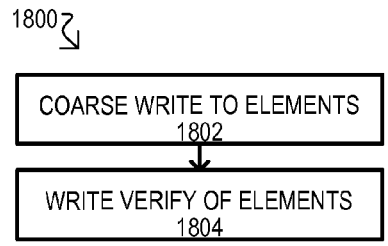
FIG. 18 is a flow diagram showing data write method according to one embodiment.

Referring now to FIG. 18 a method of writing data to programmable impedance elements is shown in a flow diagram and designated by the general reference character 1800. In very particular embodiments, a method 1800 may be executed by circuits like those shown as 206 in FIG. 2 and/or 310 in FIG. 3.

A method 1800 may include a coarse write to programmable impedance elements 1802, as well as a write verify of the elements 1804. A coarse writing 1802 may bring programmable impedance elements within an initial, relatively wide impedance range with a program operation that consumes a relatively short time period. A coarse writing 1802 may not include verification. That is, the coarse writing does not verify if elements have achieved a particular impedance value range suitable for a reading operation.

A write verify 1804 may verify that a desired impedance value has been met by reading a data value from the programmed elements after a coarse writing. Optionally, if desired impedance values are not met, write operations may be performed on such elements, either using a coarse writing operation (e.g., 1802), or another type of writing operation (examples of which are described below). Such a coarse writing and verification may be iterative: a coarse writing, followed by a verify, followed by another coarse (or other) writing until verification shows a target impedance (or impedance range) has been met.

A writing may be a programming of elements and/or an erasing of elements. In one particular arrangement, a coarse writing may be a programming of programmable metallization cells (PMCs) from a high impedance to a low impedance. Therefore, while various embodiments below show arrangements in which elements are programmed, it is understood that alternate embodiments may include arrangements in which elements are erased in the same fashion, but with different (i.e., opposite) polarity voltages and/or currents.

In this way, a write operation may include a coarse writing followed by a write verify, including iterations of such steps.

Figure 19:
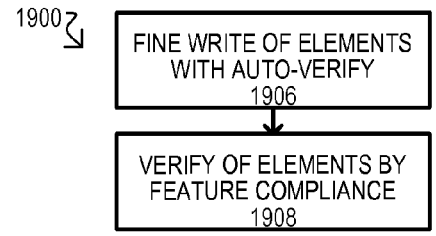
FIG. 19 is a flow diagram showing data write method according to another embodiment.

Referring now to FIG. 19, a write method according to another embodiment is shown in a flow diagram and designated by the general reference character 1900.

A method 1900 may includes a fine write of programmable impedance elements with an auto-verify 1906 and a write verify of elements by feature compliance 1908. A fine writing with auto-verification 1906 may bring programmable impedance elements within a relatively narrow impedance range. In addition, such an operation may verify that the write operation achieves a given data value. As but one example, a write value may be substantially the same as a normal read operation to provide a binary value indicating a state of a written element.

In one embodiment, a fine write/auto-verify 1906 may be an iterative operation that applies initial write conditions across selected element(s) and then verifies that an element stores a given data value results. If a given data value is not achieved, write conditions may be altered and a write operation tried once again. Such steps may repeat until a target data value is achieved, or a limit on write attempts is exceeded.

A write verify of elements by feature compliance 1908 may include verifying a state of an element according to a feature of the element, such as a current or voltage provided by the element. That is, an element may be considered written to once an accessed element provides a given current or voltage response.

As in the case of FIG. 18, method 1900 may include programming and/or erasing, and may include the programming of PMCs.

In this way, a write operation may include a write with verify operation, as well as a verify by feature compliance operation.

Figure 20:
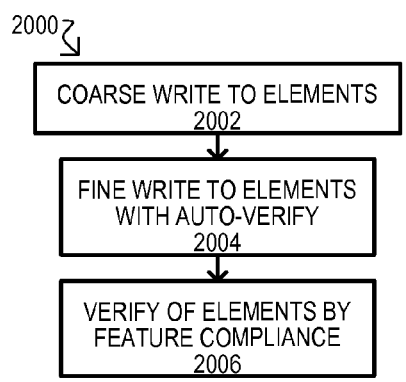
FIG. 20 is a flow diagram showing data write method according to a further embodiment.

Referring now to FIG. 20, a write method according to a further embodiment is shown in a flow diagram and designated by the general reference character 2000.

A method 2000 may include a coarse write to programmable impedance elements 2002, a fine write of programmable impedance elements 2004, and a write verify of elements 2006. A coarse write 2002 may include operations like those shown as 1802 in FIG. 18 and equivalents. A fine write 2004 may include operations like those shown as 1906 in FIG. 19, and equivalents. It is noted that a fine write 2004 may consume more time than a coarse write 2002, however, a preceding coarse write 2002 may place elements closer to a target value range prior to a fine write. A write verify 2006 may include operations like those shown in 1804 of FIG. 18 and/or 1908 of FIG. 19.

It is noted that a write verify 2006 may also occur after a coarse write 2002 but prior to a fine write 2004.

As in the case of FIG. 18, method 2000 may be a programming and/or erasing, and may include the programming of PMCs.

In this way, a write operation to programmable impedance elements may a coarse write, a fine write, and verify operation.

Figure 21:
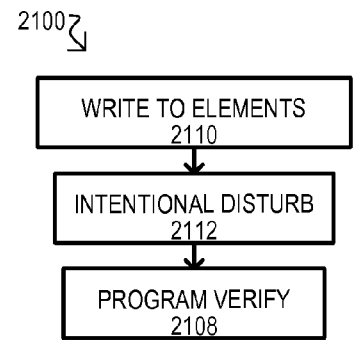
FIG. 21 is a flow diagram of a data write method according to another embodiment.

Referring now to FIG. 21, yet a further method according to an embodiment is shown in a flow diagram and designated by the general reference character 2100.

A method 2100 may include a write to programmable impedance elements 2110, an intentional disturb operation 2112, and a write verify operation 2108.

A write 2110 may include coarse and/or fine write operations shown as 1802 1906 in FIGS. 18 and 19.

An intentional disturb operation 2112 may apply conditions to written elements that, under "stronger" conditions, could reverse a write operation. As but a few examples, an initial write operation may apply a voltage across, or induce a current through, an element to cause a change in impedance. A subsequent intentional disturb may apply a voltage or current of opposite polarity across the same element, however, under conditions normally insufficient to reverse the impedance change (e.g., smaller magnitude, lesser duration, lower pulse count).

Such an intentional disturb may identify elements having poor data retention qualities by reversing the write operation.

This may allow such elements to be replaced by redundancy, or re-written under conditions that may result in a desired data retention quality.

A write verify 2108 may include verify operations noted for 1804 and/or 1908 of FIGS. 18 and 19.

Method 2100 may include the programming of elements and/or an erasing of elements. In one particular arrangement, a writing may include programming PMCs by applying a potential that is positive from anode to cathode that causes an impedance of the PMC to fall. Further, an intentional disturb may apply a potential that is negative from anode to cathode, but at a magnitude less than an erase threshold voltage, or a duration shorter than that required to fully erase the PMC.

Figure 22:
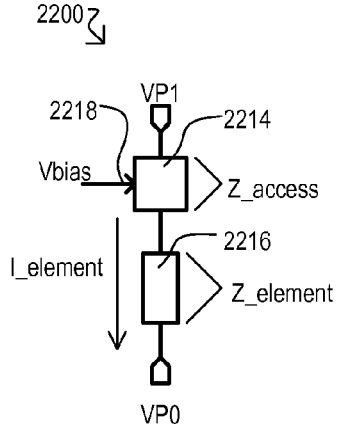
FIG. 22 is a block schematic diagram showing a self-limiting write method according to one embodiment.

Referring now to FIG. 22, a memory architecture that may be included in the write embodiments described is shown in a block schematic diagram and designated by the general reference character 2200.

A memory architecture 2200 may include an access device 2214 in series with a programmable impedance element 2245. Access device 2214 may provide an impedance (Z_access) that may be controlled according to a voltage at an input 2218. In addition or alternatively, an access device 2214 may function as a current limiter to limit a maximum current (I_element) flowing through corresponding element 2245. In the example shown, access device 2214 may receive a voltage Vbias that controls the impedance of access device 2214 and/or limits the current flowing through element 2245 (I_element).

Element 2245 may have an impedance Z_element that may be programmable between two or more different states according to a potential across the element, and/or a current flowing through the element.

In a program operation, a program voltage (VP1-VP0) may be applied across access device 2214 and element 2245.

Figure 23:
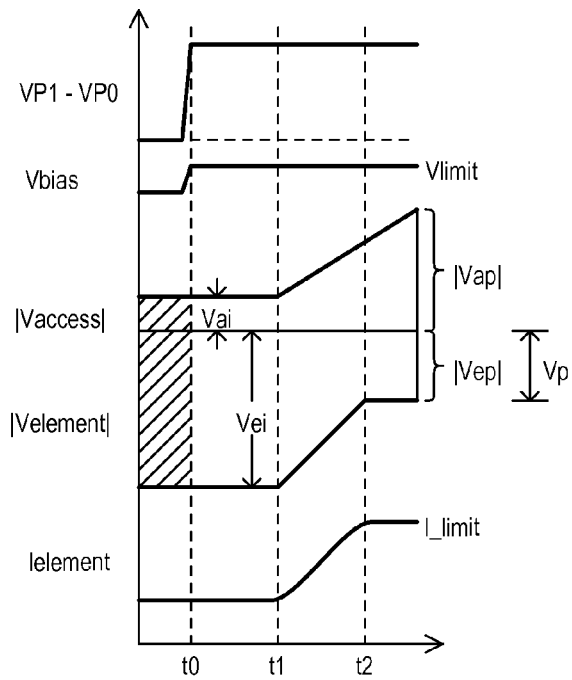
FIG. 23 is a timing diagram showing a write method like that of FIG. 22.

Referring to FIG. 23, one example of a program operation for an arrangement like that of FIG. 22 is shown in a timing diagram.

At about time t0, a bias voltage (Vbias) may be applied to access device 2214. In the example shown, such a bias voltage may limit a current through access device 2214 to a maximum value I_limit.

At about time t1, a voltage across access device 2214 and element 2245 (VP1-VP0) may rise (e.g., a program pulse may be applied). Initially, such a voltage may result in a voltage drop across the access device 2214 (Vaccess) of magnitude Vai. Further, a voltage drop cross element 2245 (Velement) may have an initial magnitude of Vei. Because element 2245 has an initial high impedance, voltage Vei may be relatively large. Such an initial voltage Vei may be greater than a programming voltage Vp for the element 2245 (i.e., the potential needed to alter the impedance of the element). At this time, a current across element I_element may begin to rise.

Following time t1, an impedance of element 2245 may begin to fall as it is programmed. In the particular embodiment shown, a voltage across access device 2214 may rise to a level Vap. However, a voltage across element 2245 may fall to Vep. Due to a current limiting effect of access device 2214, a voltage drop across element 2245 may be stop at about Vap. Current through element 2245 (Ielement) is limited to I_limit. A voltage across element 2245 at this time (Vap) may be less than a programming voltage Vp. In this way, programming may be self-limiting.

The approach shown by FIGS. 22 and 23 may be one example of a coarse writing operation like those shown as 1802 and/or 2002 of FIGS. 18 and 20.

In this way a write operation may be self limiting by biasing a voltage of an access device to a programmable impedance element.

Figure 24:
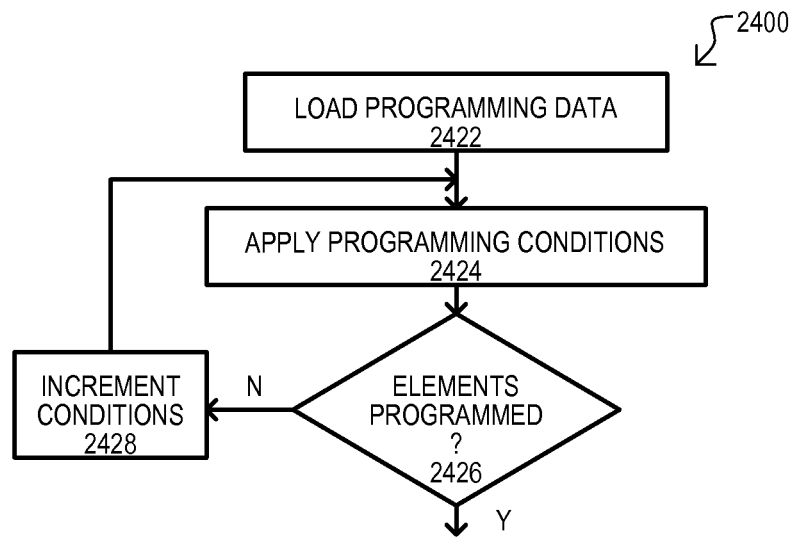
FIG. 24 is a flow diagram of a data write method according to another embodiment.

Referring now to FIG. 24, a method for fine programming is shown in a flow diagram and designated by the general reference character 2400.

A method 2400 may include loading programming data 2422. Such an operation may include receiving program data via an external source (e.g., data bus), or an internal source (e.g., data latches, volatile memory array). It is understood that according to data type ("0" or "1", or larger binary values for elements providing multiple impedance states), an element may or may not be programmed, or may be programmed in particular fashion.

Programming conditions may then be applied to selected element(s) 2424. Such an operation may include enabling voltage or current paths across selected elements to induce a change in impedance. In one very particular embodiment, programmable impedance elements may be PMCs, and such an operation may apply a voltage to an anode of selected PMCs that is positive with respect to a cathode voltage.

Elements may then be checked to determine if they are programmed 2426. Such a step may include executing a read operation to determine bit values corresponding to programmed elements. Alternatively, such a step may include determining if a feature of a programmed element (e.g., current draw, voltage drop, transient response) meets particular limitations.

If elements are determined not to be programmed (N from 2426), programming conditions may be incremented. Such an operation may include changing the conditions previously utilized to program the elements. Such conditions may include, but are not limited to: time, voltage current, current limit, ramp-time, etc.

In this way, fine write operations may increment programming conditions in the event initial programming conditions do not sufficiently change a state of a programmable impedance element.

Figure 25:
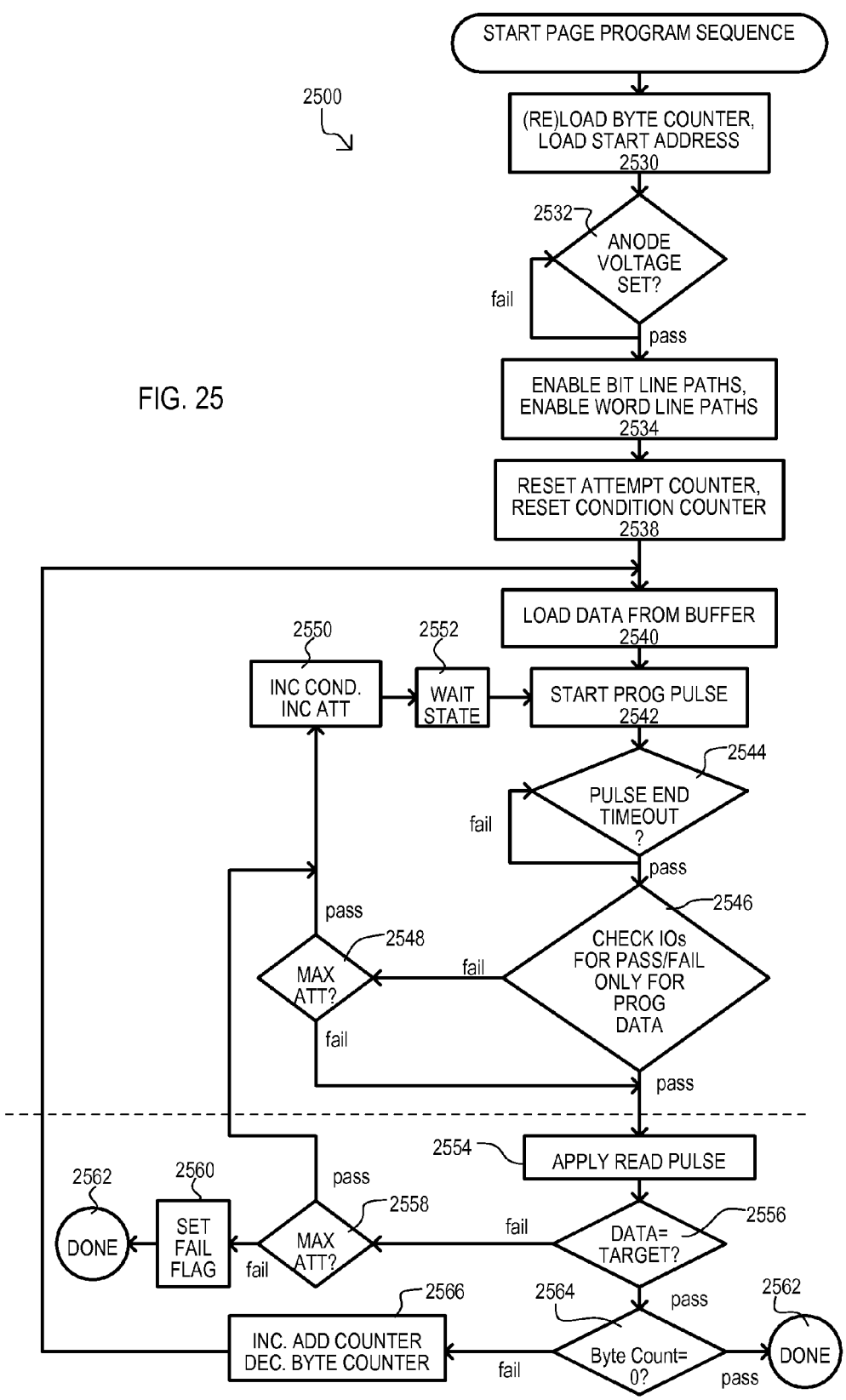
FIG. 25 is a flow diagram of a data write method according to further embodiment.

Referring now to FIG. 25, a fine programming method according to another embodiment is shown in a flow diagram and designated by the general reference character 2500. A method 2500 may be one example of those shown as 1906 and/or 2004 in FIGS. 19 and 20.

Method 2500 shows a particular embodiment in which data may be programmed into programmable impedance elements on a byte-wise basis over a range of sequential addresses. Further, in FIG. 25 it is assumed that programmable impedance elements are PMCs arranged in a "common anode" arrangement. In a common anode arrangement, PMCs of a same selected group (e.g., programmed byte(s)) may have anodes commonly connected to a same node.

A method 2500 may include loading (or reloading) a byte counter and loading a start address 2530. A byte counter may store a value corresponding to the number of bytes that will be programmed in a program operation. A start address may indicate an address at which a programming operation is to start.

A method 2500 may then check to ensure that a common anode voltage is at a desired program voltage 2532. Once such a voltage is set (pass), bit line paths and word line paths may be enabled 2532. In a particular embodiment, such an operation may include decoding address values, and in response, ensuring that a bit line path to programmed PMCs, and a word line path to corresponding access devices are ready for a program operation 2534.

An attempt counter and reset counter may then be reset 25325. An attempt counter may store the number of times a program operation tries to program a set of elements. A condition counter may store the number of times program conditions may be incremented in a program operation. Incrementing of program conditions may include making programming conditions "stronger" (i.e., more likely to program). Data may then be loaded from a buffer 2540.

A programming pulse may then be applied 2542. In one particular embodiment, this may include having the anode of accessed elements set to an anode program voltage, and then applying a cathode program voltage through a bit line and an access device to those PMCs being programmed.

Once a pulse is determined to be complete or the program pulse has timed out (pass from 2544), a read from inputs/outputs (I/Os) may take place to determine if data has been programmed. In one particular embodiment, such a step may only check that a programmed bit is programmed (i.e., non-programmed bits, or bits that are erased are not checked) 2546. As noted above, in an alternate embodiment that may selectively erase bit values, once an erase pulse has been determined to be complete or timed out, such erased bits may be checked to ensure they yield suitable data values.

If such an operation determines that elements have not been successfully programmed (fail from 2546), a method may determine if a maximum number of program attempts has yet been reached 2548. If such a maximum number of attempts has not been reached (pass), a method 2500 may increment the number of attempts and increment the programming conditions 2550. Incrementing attempts results in the number of program attempts approaching, or reaching a maximum attempt value. Incrementing the programming conditions 2550 may increase the parameters utilized to program selected PMCs. As but a few examples, incrementing conditions may include incrementing a magnitude of a programming voltage or allowable programming current, increasing a ramp rate of a programming voltage or allowable programming current, and/or increasing the duration and/or number of programming pulses. In the embodiment shown, there may be a wait state 2552 between the incrementing or program conditions, and the application of a programming pulse under the new programming conditions.

If an operation determines that elements have been successfully programmed (pass from 2546), or if a maximum number of attempts has been reached (fail from 2548), a method may apply a read pulse to the selected PMCs 2554 to read out the programmed data. If such a read operation determines that data is different than target data (fail from 2556), a method may determine once again if a maximum number of program attempts has been reached 2558. If such a maximum number of attempts has not been reacted (pass), a method 2500 may proceed to increment programming conditions (return to 2550). If a maximum number of attempts has been reached (fail from 2558), a failure condition may be indicated. In the embodiment shown, this may include setting a fail flag 2560. A programming method may then end 2562.

If data read in response to a read pulse achieves at target data value (pass from 2556), a method may determine if a last byte has been programmed 2564. If a last byte has not been reached (fail from 2564), an address counter may be incremented, and a byte counter may be decremented (2566). A method may then load a next set of data (return to 2540). If a last byte has been reached (pass from 2564), a programming method may end 2562.

Figure 26:
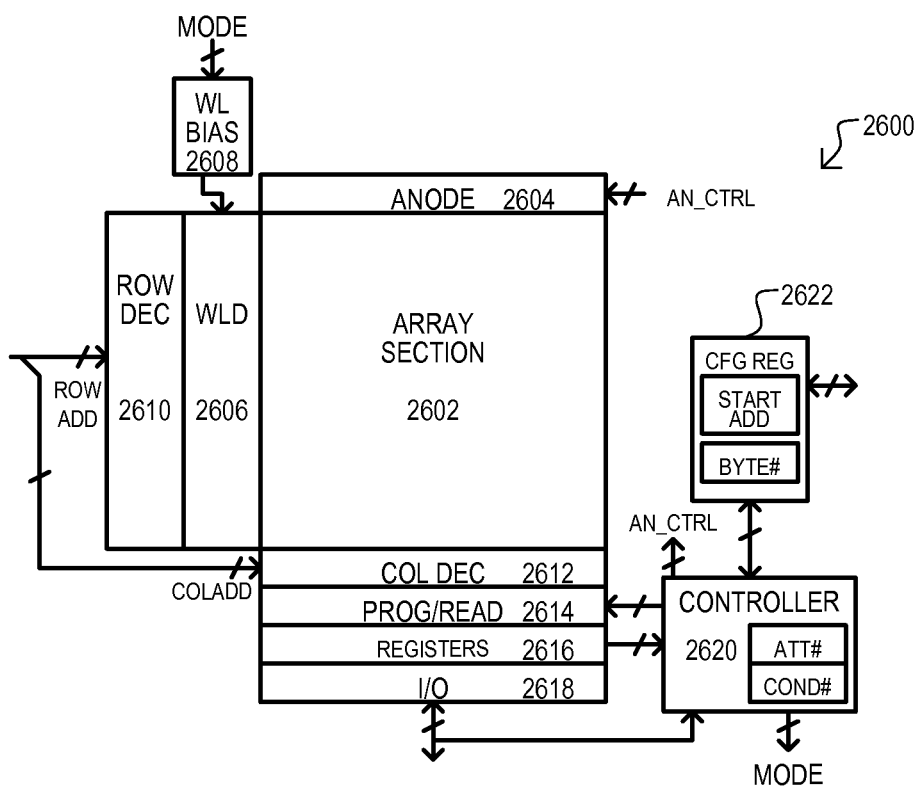
FIG. 26 is a block schematic diagram of a memory device according to one embodiment.

Having described various write methods, memory devices that may employ such methods will now be described. Referring now to FIG. 26, a memory device 2600 according to an embodiment is shown in a block schematic diagram. In one particular embodiment, a memory device 2600 may execute a method like that shown in FIG. 25. A memory device 2600 may be one example of a memory array like that shown as 204 in FIG. 2.

A memory device 2600 may include an array section 2602 having a number of PMCs accessible by an access device. An anode control circuit 2604 may apply an anode voltage to PMCs in a programming operation. A word line driver 2606 may drive access devices within array section 2602 with a bias voltage (Vbias) generated from a word line bias circuit 2608. A word line bias circuit 2608 may vary a bias voltage (Vbias) based on a mode of operation (MODE). In particular, a bias voltage (Vbias) may enable a coarse programming operation described herein, and equivalents. A row decoder 2610 may select word lines based on a received row address (ROWADD).

A column decoder 2612 may provide access paths to bit lines based on a column address (COLADD). Bit lines may be connected to cathodes of PMCs within an array section 2602. Write/read circuits 2614 may apply read, program and erase bias potentials to PMCs via selected bit lines. In addition, write/read circuits 2614 may read data values from selected PMCs. Registers 2645 may store received data values that may be programmed into PMCs of array sections 2602. Input/output (I/O) circuit 2618 may provide data paths for providing write data to, or outputting read data from memory device 2600.

A controller 2620 may provide control signals for controlling operations of memory device 2600, including programming operations described herein. A controller 2620 may apply control signals to write/read circuit 2614 to control the application of bias voltages for program, read and erase operations. In addition, a controller 2620 may compare write data output from I/O circuit 2618 to target write data stored in registers 2645 to auto-verify a program operation. A controller 2620 may provide a mode signal MODE and anode control signals AN_CTRL. Within controller 2620, an attempt count value (ATT#) may track the number of times a programming operation has been attempted. Such a value may be reset at the start of a program operation, and then track the number of times a programming operation is attempted on a set of program data. A condition value (COND#) may dictate the programming conditions enabled within write/read circuits 2614 by controller 2620. Such a value may be incremented in the event a program operation is not initially successful.

Control registers 2622 may store values executing program and other operations. In the example shown, control registers 2622 may store a start address (START ADD) to indicate where a program operation should start. Such a value may be incremented to access sequential addresses. A byte count value (BYTE#) may indicate a number of bytes written in a program operation. Such a value may be decremented in values are programmed until a program operation is completed.

Figure 26A:
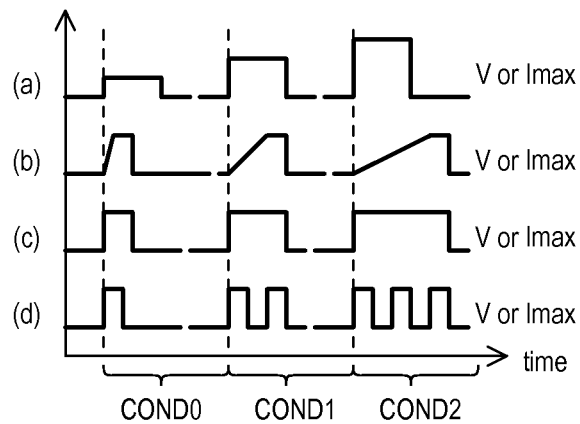
FIGS. 26A to 26C are diagrams showing write methods and operations according to various embodiments.
Figure 26B:
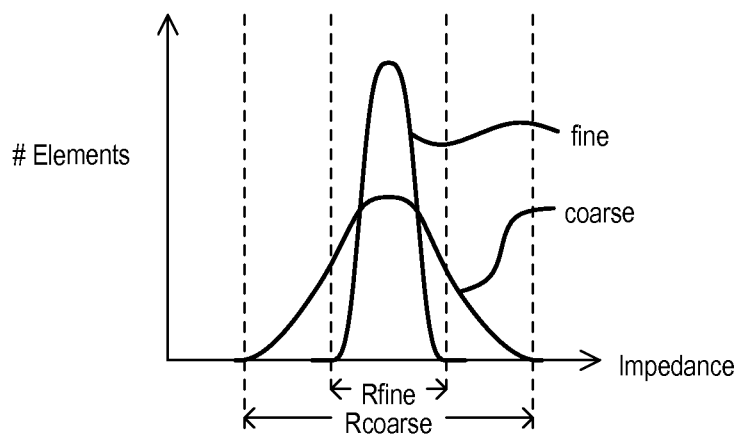
Figure 26C:
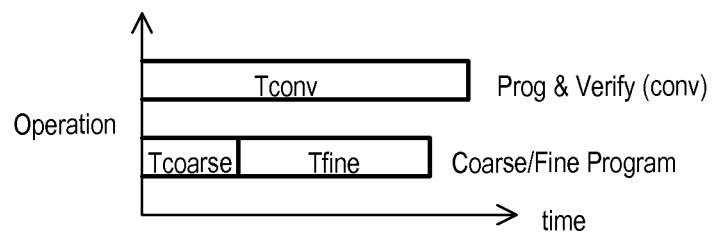

Referring now to FIGS. 26A to 26C, various write operations according to embodiments are shown in a series of diagrams.

FIG. 26A is a timing diagram showing how programming conditions may be incremented in the event a preceding programming is not successful. FIG. 26A shows three increasingly higher conditions (COND0, COND1, COND2) for four possible programming conditions, shows as (a) through (d). It is understood that the four conditions are but possible examples.

Waveform (a) shows how an amplitude of an applied voltage and/or a maximum allowable program current may be increased for different conditions.

Waveform (b) shows how a ramp rate of an applied voltage and/or a maximum allowable program current may be increased for different conditions.

Waveform (c) shows how a pulse duration of a programming voltage or current may be increased for different conditions.

Waveform (d) shows how a number of pulses of a programming voltage or current may be increased for different conditions.

FIG. 26B is a graph showing how programming results may vary between a coarse program operation and a fine programming operation according to an embodiment. Line "coarse" shows how a coarse programming may bring programmable impedance devices within a first range (Rcoarse). Line "fine" shows how a fine programming may bring programmable impedance devices within a second range (Rfine) that is narrower than the first range (Rcoarse).

FIG. 26C is a diagram showing how a coarse programming operation may last for a duration Tcoarse and a fine programming operation may last for a duration Tfine. A total of these time periods may be less than programming time period (Tconv) for approaches that program and verify on a bit-by-bit basis.

Figure 27:
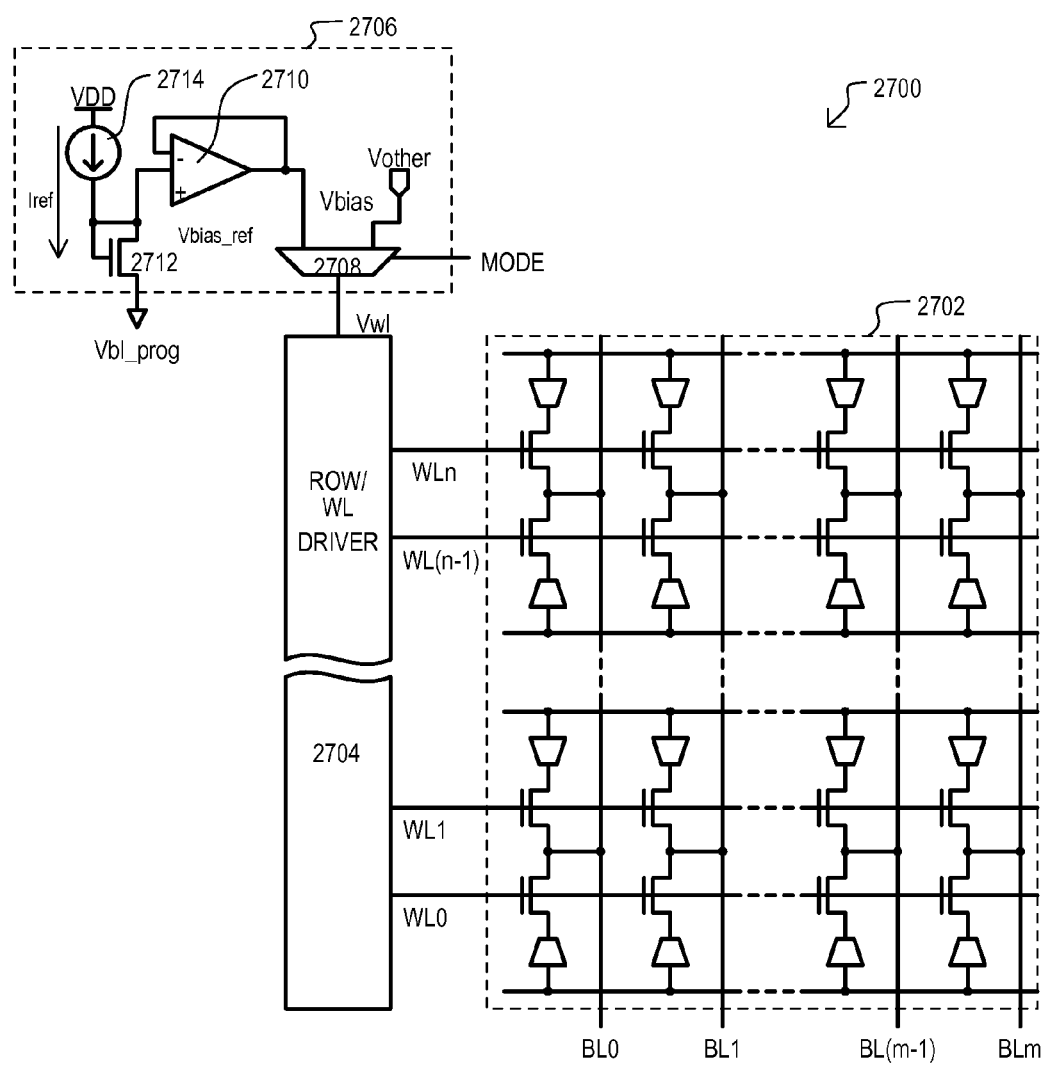
FIG. 27 is block schematic diagram of a write biasing architecture according to an embodiment.

Referring now to FIG. 27, an access device biasing architecture according to an embodiment is shown in a block schematic diagram and designated by the reference character 2700. An access device biasing architecture 2700 may control access device potentials to enable self-limiting program operations and the like.

A biasing architecture 2700 may include an array of memory cells 2702, a word line driver circuit 2704, and a word line bias circuit 2706.

Array 2702 may include a number of memory cells, each including one PMC and one n-channel MOS access device. Anodes of PMCs of a same row may be commonly connected to an anode line. In one very particular embodiment, all anode lines may be connected together for a common anode array. Access devices of a same row may be commonly connected to a same word line (WL0 to WLn). Access devices of a same column may be commonly connected to a same bit line (BL0 to BLm). In such an arrangement, cathode voltages for program operations may be applied via bit lines (BL0 to BLm).

Word line driver circuit 2704 may drive word lines with a voltage Vwl provided from a bias circuit 2706. A voltage Vwl may vary according to operation (e.g., program, read, erase).

A bias circuit 2706 may include a supply MUX 2708, a bias amplifier 2710, a reference transistor 2712, and a reference current supply 2714. A supply MUX 2708 may have an output that provide voltage Vwl, an input that may provide voltages in operations other than program operations (Vother), and another input that receives a bias voltage Vbias. In the very particular example of FIG. 27, a bias voltage Vbias may be generated by a bias amplifier 2710 which may be an operational amplifier (op amp) having a unity gain configuration. Bias amplifier 2710 may receive a reference bias voltage (Vbias_ref) generated by reference transistor 2712 and a reference current supply 2714. A reference transistor 2712 may have a "diode" configuration (gate connected to its drain), and may match access devices of array 2702. A source of reference transistor 2712 may be connected to a voltage Vbl_prog, which may be the same as a voltage applied to bit lines (BL0 to BLm) in a program operation. In some embodiments, a voltage Vbl_prog may be a low power supply voltage (e.g., VSS, ground). However, in other embodiments, such a voltage may be greater than a low power supply, depending upon the voltage seen by bit lines during the program operation (e.g., circuits connected to bit lines may result in a different voltage being applied to the bit lines). In one particular embodiment, reference transistor 2712 may have the same dimensions and layout as the access devices of array 2702. A reference current supply 2714 may provide a reference current Iref to reference transistor 2712 selected to induce a desired bias voltage across access devices in a program operation.

In this way, a voltage applied to access devices may vary according operation.

As noted above, embodiments may also include programmable circuits that may be configured for different functions according to states of programmable impedance elements. Such embodiments will now be described.

Referring to FIG. 28, an integrated circuit device according to another embodiment is shown in a block schematic diagram and designated by the general reference character 2800. Device 1800 may be one particular example of that shown as 308 in FIG. 3.

A device 2800 may include a programmable link 2802 formed between a first circuit section 2804-0 and a second circuit section 2804-28. Programmable link 2802 may be altered (programmed or erased) via application of a voltage and/or current, from a high impedance to a low impedance, and thus provide an electrical signal link between sections (2804-0 and 2804-28). In addition or alternatively, programmable link 2802 may be altered via application of a voltage and/or current, from a low impedance to a high impedance, and thus prevent an electrical signal link between sections (2804-0 and 2804-28).

A programmable link 2802 may include one or more programmable impedance elements. The embodiment of FIG. 3-28 shows multiple (in this case "n") programmable impedance elements 2806-28 to 2806-$n$. Each programmable impedance element (2806-28 to 2806-$n$) may be altered to provide a high or low impedance state. Individually, one programmable impedance element may not be suitable as a programmable link, as an applied signal from a circuit section (2804-0 or 2804-28) may alter a state of the element. For example, signals from circuit sections (2804-0 and 2804-28) may be sufficient magnitude to program or erase an element (2806-28 to 2806-N), or may "disturb" such an element. A disturb may be an unintentional alteration in impedance. By including multiple impedance elements in series, an overall link may be more resistant to disturb conditions.

In this way, a programmable link may be formed by multiple programmable impedance elements arranged in series with one another.

Referring to FIG. 29, a programmable link 2902 according to an embodiment is shown in a schematic diagram. A programmable link 2902 may be one particular implementation of that shown as 2802 in FIG. 28. In the embodiment shown, a programmable link 2902 may include three (n=3) programmable impedance elements (2906-1 to 2906-3). In a particular embodiment, such programmable impedance elements may be programmable metallization cells (PMC). In other embodiments, n may be greater than or less than three (but greater than one).

In this way, a programmable link may be formed by multiple PMCs arranged in series with one another.

Referring to FIG. 30, a programmable link 3002 according to another embodiment is shown in a schematic diagram. A programmable link 3002 may also be one particular implementation of that shown as 2802 in FIG. 28.

In the embodiment shown, a programmable link 3002 may include groups of series connected programmable elements arranged in parallel with one another. The example of FIG. 30 includes a first group of series connected PMCs (3006-00 to 3006-030) arranged in parallel with a second group of series connected PMCs (3006-10 to 3006-130).

Such a parallel arrangement may help reduce an overall impedance when the programmable link 3002 is altered to a low impedance state. In other embodiments, a programmable link may include fewer or greater numbers of PMCs in series connection, as well as more than two parallel connected groups of PMCs.

In this way, a programmable link may be formed by groups of programmable impedance elements arrange in parallel with one another, each such group having elements arranged in series with one another.

Referring now to FIG. 31, a graph shows how a number of series selected impedance elements may provide a higher resistance to disturb conditions. In the graph shown, it is assumed that an individual programmable impedance element may have a disturb voltage level Vdist. That is, if a voltage greater than Vdist is applied across an impedance element, a change in the elements impedance may result.

In addition, FIG. 31 shows high and low signal levels applied to a programmable link as voltages VH and VL. As shown, a number of "N" programmable impedance elements may be connected in series with one another to ensure that an overall link disturb voltage (Vlinkdist=N*Vdist) is greater than VH−VL.

Referring now to FIG. 32, a link program/erase circuit according to an embodiment is shown in a block schematic diagram and designated by the general reference character 3200. In the embodiment shown, a link program/erase circuit 3200 may program or erase a programmable link 3202. In FIG. 32, programmable link 3202 may be formed from a series connection of four programmable impedance elements, which in this example may be PMCs. A first switch 3208-0 may connect a first link terminal 3210-0 to a stack anode voltage VAN_STK, which may vary according to operation (e.g., program or erase). A second switch 3208-1 may connect a second link terminal 3210-1 to a stack cathode voltage VCAT_STK, which may also vary according to operation. Optionally, program/erase circuit 3200 may include isolation structures 3212-0/1.

Each individual element of link 3202 may have a program threshold voltage Vtp. If a voltage across an element exceeds Vtp (in a predetermined direction), an impedance of the element my change (e.g., go from a high impedance to a low impedance). Similarly, each individual element may have an erase threshold voltage Vte. If a voltage across an element exceeds Vte (in an opposite direction to the program operation), an impedance of the element my change (e.g., go from a low impedance to a high impedance). Voltages Vtp and Vte may, or may not be symmetrical (i.e., Vtp may be the same as, or different than Vte).

FIG. 32 shows an arrangement in which the series elements of link 3202 may be programmed all at once. In a program operation, first switch 3208-0 may connect voltage VAN_STK(Prog) to first link terminal 3210-0. Second switch 3208-1 may connect voltage VCAT_STK(Prog) to a second link terminal 3210-1. A resulting voltage (VAN_STK(Prog)−VCAT_STK(Prog)) across programmable link 3202 may exceed a sum of the programming threshold voltages for all elements. That is, VAN_STK(Prog)−VCAT_STK(Prog)>N*Vtp (where N is four in this particular example).

In an erase operation, first switch 3208-0 may connect voltage VAN_STK(Erase) to first link terminal 3210-0, and second switch 3208-1 may connect voltage VCAT_STK (Erase) to a second link terminal 3210-1. A resulting voltage (VCAT_STK(Erase)−VAN_STK(Erase)) across programmable link 3202 may exceed a sum of the erase threshold voltages for all elements. That is, VCAT_STK(Erase)−VAN_STK(Erase)>N*Vte.

In the event applied voltages may exceed tolerances of other circuit elements, isolation structures 3212-0/1 may be included to provide a high impedance that may isolate other circuit elements from applied program/erase voltages. As but one example, isolation structures 3212-0/1 may include high voltage transistors.

In a standard operation, in which a signal received at IN propagates to an output OUT, first and second switches (3208-0/1) may present a high impedance. Further, if isolation structures 3212-0/1 are included, such devices may present a low impedance.

FIG. 33 shows how a programming voltage across a programmable link may exceed a total of the programming threshold voltage of the N series connected elements in the link, as described above for FIG. 32.

FIG. 34 shows how an erase voltage across a programmable link may exceed a total of the erase threshold voltage of the N series connected elements in the link, as described above for FIG. 32.

In this way, series programmable impedance elements of a link may be programmed or erased together to establish a link state.

Figure 35:
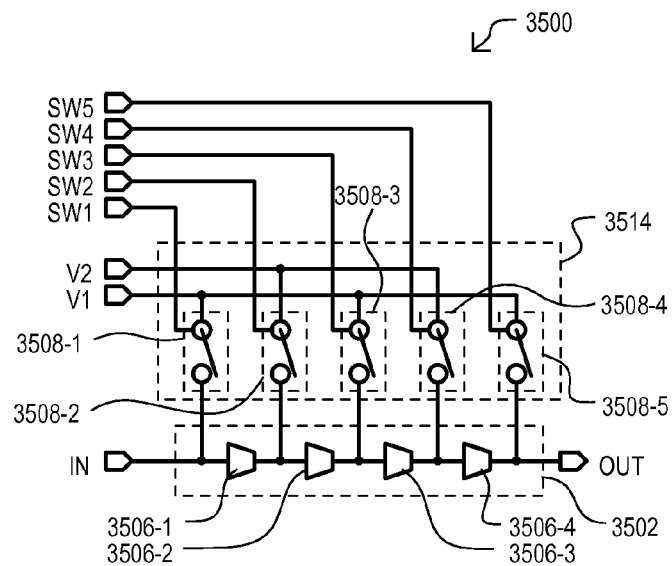
FIG. 35 is a block schematic diagram of a program/erase circuit for a programmable link according to another embodiment.

Referring now to FIG. 35, a link program/erase circuit according to another embodiment is shown in a block schematic diagram and designated by the general reference character 3500. In the embodiment shown, a link program/erase circuit 3200 may program or erase a programmable link 3502.

In the embodiment shown, a programmable link 3502 may be formed from a series connection of four programmable impedance elements 3506-1 to 3506-4, which in this example may be PMCs. A switch circuit 3514 may include switches 3508-1 to 3508-5, controlled by signals SW1 to SW5, respectively. Switch 3508-1 may connect voltage source V1 to an input of programmable link 3502 (i.e., anode of element 3506-1). Switch 3508-2 may connect voltage source V2 between elements 3506-1 and 3506-2. Switch 3508-3 may connect voltage source V1 between elements 3506-2 and 3506-3. Switch 3508-4 may connect voltage source V2 between elements 3506-3 and 3506-4. Switch 3508-5 may connect voltage source V1 to an output of programmable link 3502 (i.e., cathode of element 3506-4).

Voltage sources V1 and V2, may provide a voltage that varies according to different stages of a program or erase operation, as will be described below in FIGS. 36 and 37.

The embodiment of FIG. 35 may enable each element to be programmed individually. Accordingly, voltage sources V1 and V2 need only provide a single element threshold voltage (Vtp, Vte) instead of multiples of such voltages, as would be the case for the embodiments shown in FIGS. 32-34.

Figure 36:
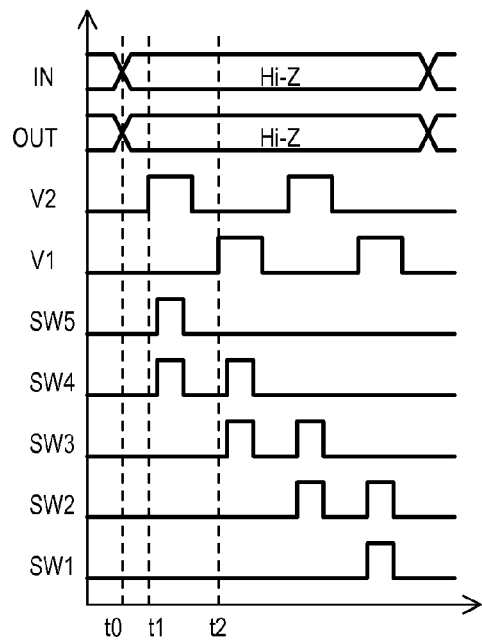
FIG. 36 shows a program operation of a circuit like that of FIG. 35.

FIG. 36 shows a programming operation for a circuit like that of FIG. 35. Such a programming operation may place programmable link 3502 into a low impedance state. It is assumed that elements 3506-1 to 3506-4 are all initially in a high impedance state. The illustrated operation programs each element (3506-1 to 3506-4) individually into a low impedance state, in the order 3506-4→3506-3→3506-2→3506-1.

At about time t0, input (IN) and output (OUT) may be placed into high impedance (Hi-Z) states. Signals SW1 to SW5 may all be inactive (low), placing switches (3508-1 to 3508-5) into an open state.

At about time t1, voltage source V2 may rise to a high voltage, while voltage source V1 may be at a low voltage. Subsequently, signals SW4 and SW5 may be activated, applying a high voltage (V2=high) to an anode of element 3506-4, and a low voltage (V1=low) to a cathode of element 3506-4. At this time, V2−V1>Vtp, and element 3506-4 may be programmed to a low impedance state.

At about time t2, voltage source V1 may fall to a low voltage, while voltage source V2 may rise to a high voltage. Subsequently, signals SW4 and SW3 may be activated, applying a high voltage to an anode of element 3506-3, and a low voltage to a cathode of element 3506-3, and element 3506-3 may be programmed to a low impedance state.

The above procedure may be repeated for the remaining elements, as shown in FIG. 36, with element 3506-2 being programmed to a low impedance state, followed by element 3506-1 being programmed to a low impedance state.

In this way, series connected impedance elements may be sequentially programmed to low impedance states.

Figure 37:
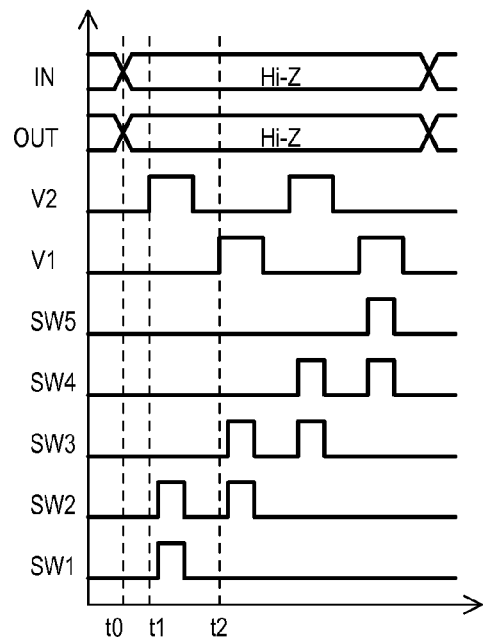
FIG. 37 shows an erase operation of a circuit like that of FIG. 35.

FIG. 37 shows an erase operation for a circuit like that of FIG. 35. Such an erase operation may place programmable link 3502 into a high impedance state. It is assumed that elements 3506-1 to 3506-4 are all initially in a low impedance state. The illustrated operation programs each element (3506-1 to 3506-4) individually into a high impedance state, in the order 3506-1→3506-2→3506-3→3506-4.

At about time t0, input (IN) and output (OUT) may be placed into high impedance states. Signals SW1 to SW5 may all be inactive (low), placing switches (3508-1 to 3508-5) into an open state.

At about time t1, voltage source V2 may rise to a high voltage, while voltage source V1 may be at a low voltage. Subsequently, signals SW1 and SW2 may be activated, applying a low voltage (V1=low) to an anode of element 3506-1, and a high voltage (V2=high) to a cathode of element 3506-1. At this time, V1−V2<Vte (where Vte is a negative value), and element 3506-1 may be erased to a high impedance state.

At about time t2, voltage source V2 may fall to a low voltage, while voltage source V1 may rise to a high voltage. Subsequently, signals SW2 and SW3 may be activated, applying a high voltage (V1=high) to a cathode of element 3506-2, and a low voltage (V2=low) to an anode of element 3506-2. At this time, V2−V1<Vte, and element 3506-2 may be erased to a high impedance state.

The above procedure may be repeated for the remaining elements, as shown in FIG. 37, with element 3506-3 being erased to a high impedance state, followed by element 3506-4 being erased to a high impedance state.

In this way, series connected impedance elements may be sequentially erased to high impedance states.

Figure 38:
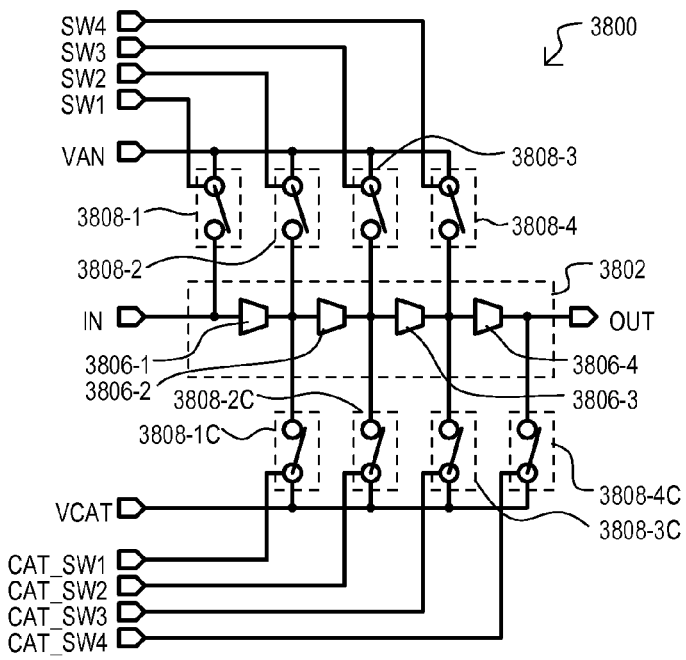
FIG. 38 is a block schematic diagram of a program/erase circuit for a programmable link according to a further embodiment.

Referring now to FIG. 38, a link program/erase circuit according to a further embodiment is shown in a block schematic diagram and designated by the general reference character 3800. In the embodiment shown, a link program/erase circuit 3200 may program or erase a programmable link 3802.

In the embodiment shown, a programmable link 3802 may be formed from a series connection of four programmable impedance elements 3806-1 to 3806-4, which in this example may be PMCs. Program erase circuit 3800 may include anode voltage switches 3808-1 to 3808-4 and cathode voltage switches 3808-1C to 3808-4C. Switches 3808-1 to 3808-4 may be controlled by signals SW1 to SW4, respectively. Switches 3808-1C to 3808-4C may be controlled by signals controlled by signals CAT_SW1 to CAT_SW4, respectively.

Switch 3808-1 may connect voltage source VAN to an input of programmable link 3802 (i.e., anode of element 3806-1). Switch 3808-2 may connect voltage source VAN between elements 3806-1 and 3806-2. Switch 3808-3 may connect voltage source VAN between elements 3806-2 and 3806-3. Switch 3808-4 may connect voltage source VAN between elements 3806-3 and 3806-4.

Switch 3808-1C may connect voltage source VCAT between elements 3806-1 and 3806-2. Switch 3808-2C may connect voltage source VCAT between elements 3806-2 and 3806-3. Switch 3808-3C may connect voltage source VCAT between elements 3806-3 and 3806-4. Switch 3808-4C may connect voltage source VCAT to an output of programmable link 3802 (i.e., cathode of element 3806-4).

Voltage sources VAN and VCAT, may provide a voltage that varies according to different stages of a program or erase operation, as will be described below in FIGS. 39 and 40.

Figure 39:
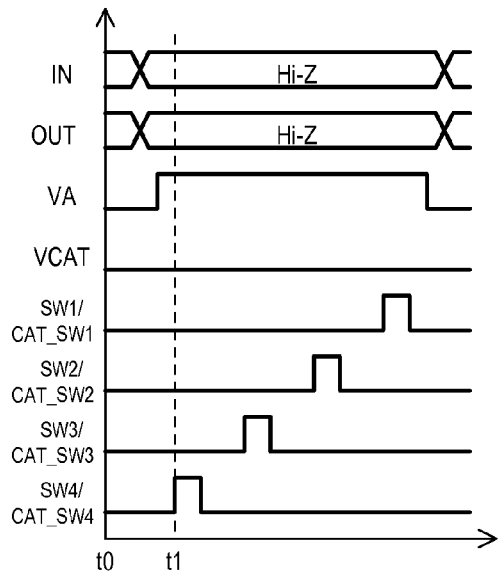
FIG. 39 shows a program operation of a circuit like that of FIG. 38.

FIG. 39 shows a programming operation for a circuit like that of FIG. 38 that places programmable link 3802 into a low impedance state. It is assumed that elements 3806-1 to 3806-4 are all initially in a high impedance state. The illustrated operation programs each element individually into a low impedance state, in the order 3806-4→3806-3→3806-2→3806-1.

At about time t0, input (IN) and output (OUT) may be placed into high impedance states. Signals SW1 to SW4 and CAT_SW1 to CAT_SW4 may all be inactive (low), placing switches (3808-1 to 3808-4, 3808-1C to 3808-4C) into an open state. Subsequently, voltage source VAN may rise to a high voltage, while voltage VCAT is maintained at a low voltage.

At about time t1, signals SW4 and CAT_SW4 may be activated, applying a high voltage (VAN=high) to an anode of element 3806-4, and a low voltage (VCAT=low) to a cathode of element 3806-4. At this time, VAN−VCAT>Vtp, and element 3806-4 may be programmed to a low impedance state.

As shown in FIG. 39, throughout the programming operation VAN may remain high, while VCAT may remain low. Switch pairs SW3/CAT_SW3, SW2/CAT_SW2, and SW1/CAT_SW1 may be sequentially activated, resulting in the programming of elements 3806-3, 3806-2 and 3806-1 (in that order).

Figure 40:
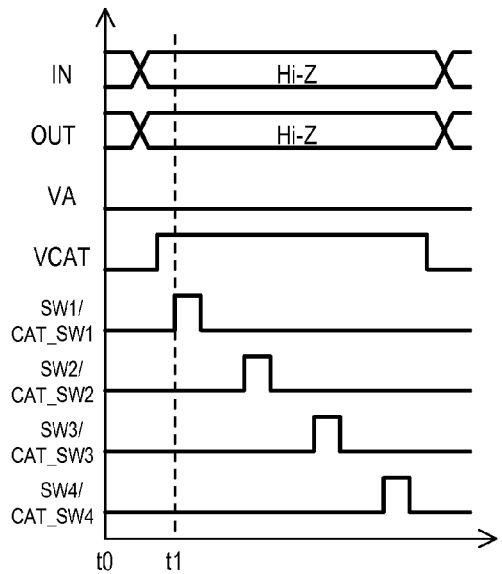
FIG. 40 shows an erase operation of a circuit like that of FIG. 38.

FIG. 40 shows an erasing operation for a circuit like that of FIG. 38 that places programmable link 3802 into a high impedance state. It is assumed that elements 3806-1 to 3806-4 are all initially in a low impedance state. The illustrated operation erases each element individually into a high impedance state, in the order 3806-1→3806-2→3806-3→3806-4.

At about time t0, input (IN) and output (OUT) may be placed into high impedance states. Signals SW1 to SW4 and CAT_SW1 to CAT_SW4 may all be inactive (low), placing switches (3808-1 to 3808-4, 3808-1C to 3808-4C) into an open state. Subsequently, voltage source VCAT may rise to a high voltage, while voltage VAN is maintained at a low voltage.

At about time t1, signals SW1 and CAT_SW1 may be activated, applying a high voltage (VCAT=high) to a cathode element 3806-1, and a low voltage (VAN=low) to an anode of element 3806-1. At this time, VAN−VCAT<Vte (Vte being a negative value), and element 3806-1 may be erased to a high impedance state.

As shown in FIG. 38, throughout the erasing operation VAN may remain low, while VCAT may remain high. Switch pairs SW2/CAT_SW2, SW3/CAT_SW3, and SW4/CAT_SW4 may be sequentially activated, resulting in the erasing of elements 3806-2, 3806-3 and 3806-4 (in that order).

Figure 41:
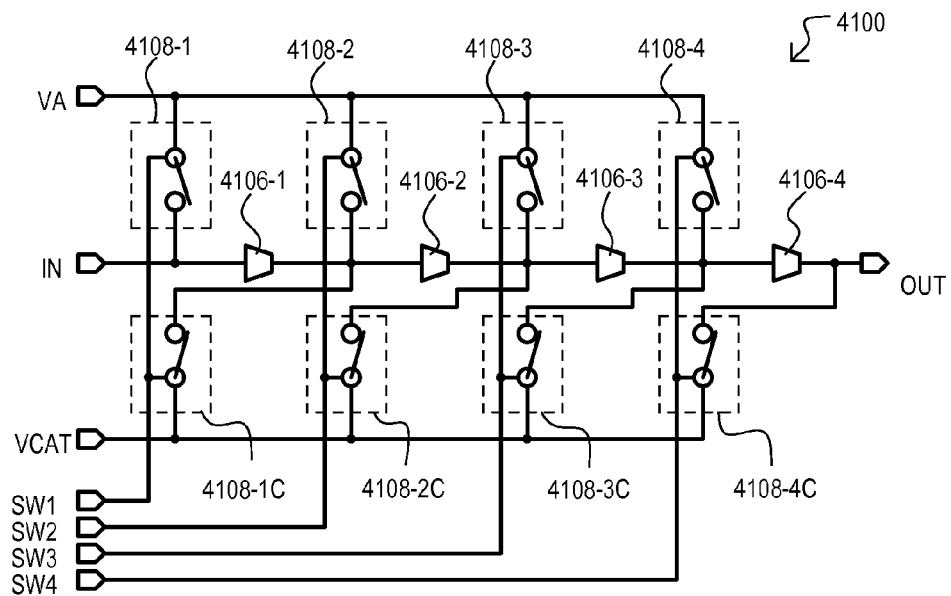
FIG. 41 is a block schematic diagram of a program/erase circuit for a programmable link according to another embodiment.
Figure 42:
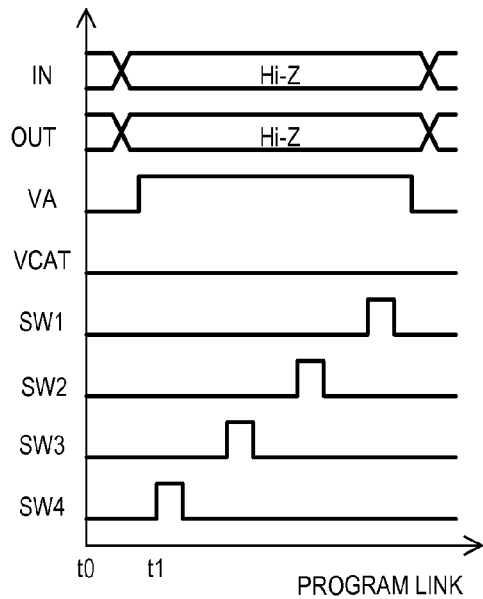
FIG. 42 shows a program operation of a circuit like that of FIG. 41.
Figure 43:
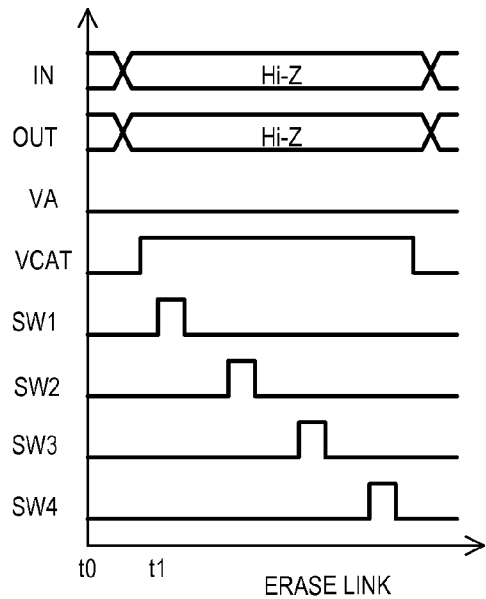
FIG. 43 shows an erase operation of a circuit like that of FIG. 41.

FIGS. 41 to 43 show an arrangement like that of FIGS. 38 to 40, however, switch pairs 4108-1/4108-1C, 4108-2/4108-2O, 4108-3/4108-3O, 4108-4/4108-4O may be commonly controlled by signals SW1, Sw2, SW3, SW4, respectively.

Referring now to FIG. 44, a programmable link structure according to one embodiment is shown in block diagram and designated by the reference character 4400.

A link structure 4400 may be formed from separated PMC structures 4445-0 to 4445-3. In particular, PMCs (4445-0 to 4445-3) may be formed as separate stacks, each including an anode, a cathode, and an intermediate resistive switching material (SW MATERIAL) formed between. In arrangements in which each PMC is programmed and/or erased individually, connections 4418 may be formed at series connections between PMCs.

Referring now to FIG. 45, a programmable link structure according to another embodiment is shown in block diagram and designated by the reference character 4500.

A link structure 4500 may be formed from integral PMC structures. In particular, link structure 4500 may include PMC sections (4516-1 to 4516-4) formed as portions of a single structure composed of an anode layer, a switching material layer, and a cathode layer repeated N times in an integral structure.

Referring to FIG. 46, an integrated circuit device circuit according to another embodiment is shown in a block schematic diagram and designated by the general reference character 4600. Device 4600 may be one particular example of that shown as 308 in FIG. 3.

A circuit 4600 may be a multiplexer (MUX). MUX circuit 4600 may selectively connect one input (one of IN0 to IN3) to an output S_OUT. Such a connection may be made by altering the conductivity of a programmable link that includes a series connection of multiple programmable impedance elements.

In this way, a programmable MUX may be configured by programming link elements that include series connected programmable impedance elements.

Figure 47:
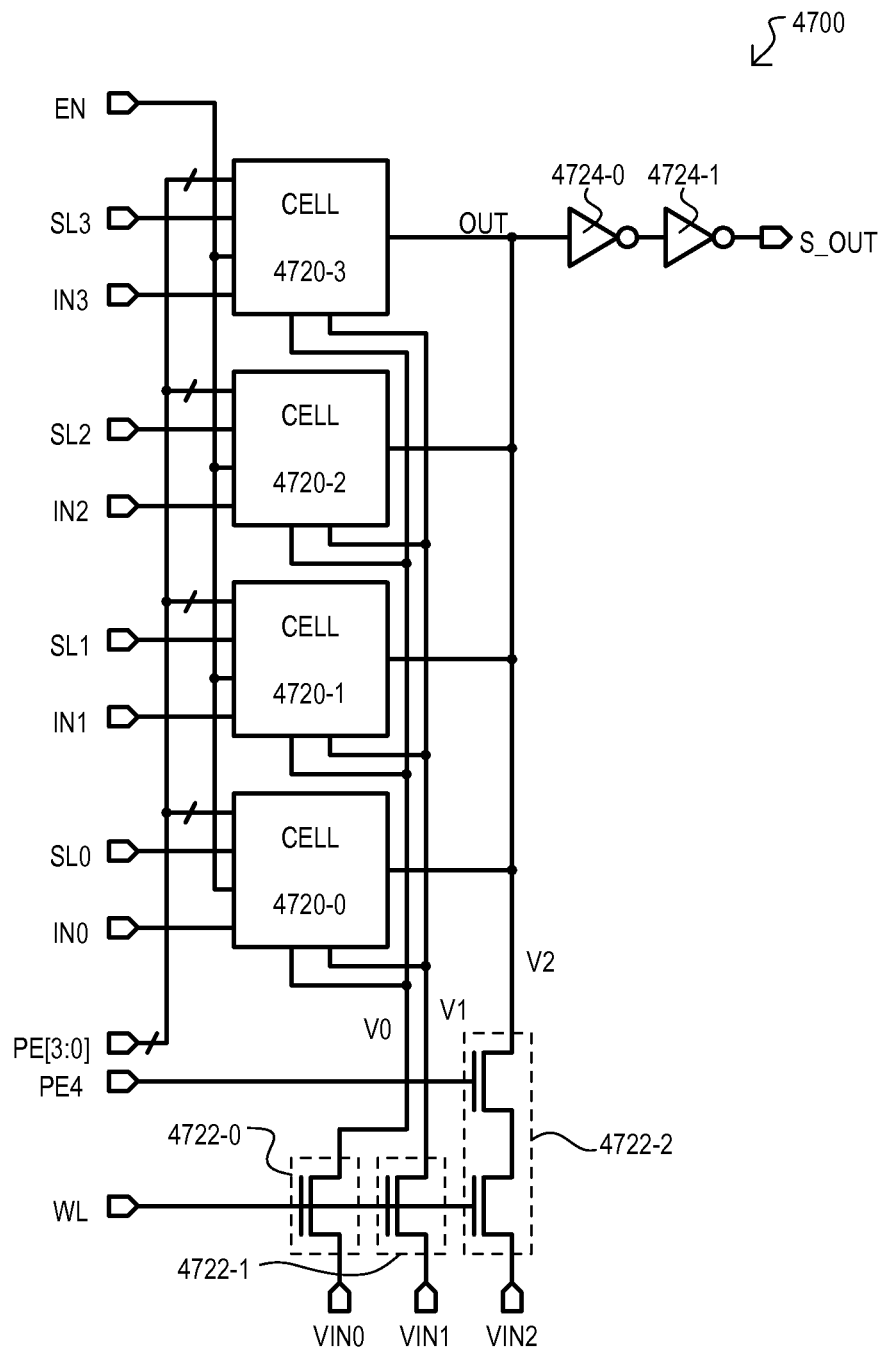
FIG. 47 is a block schematic diagram of a programmable MUX according to another embodiment.

Referring now to FIG. 47, a programmable MUX according to an embodiment is shown in a block schematic diagram and designated by the general reference character 4700. A programmable MUX 4700 may be one particular implementation of that shown in FIG. 46.

A programmable MUX 4700 may include four inputs IN0 to IN3, any of which may be connected to output S_OUT. MUX 4700 may include a cell 4720-0 to 4720-3 corresponding to each input, as well as voltage selectors 4722-0, 4722-1 and 4722-2.

Each cell (4720-0 to 4720-3) may receive a corresponding input signal (IN0 to IN3) and a select signal (SL0 to SL3). In addition, each cell (4720-0 to 4720-3) may be commonly connected to receive a same enable signal EN, a same set of control signals PE[3:0], and a pair of selected voltages V0 and V1. Cells (4720-0 to 4720-3) may have outputs commonly connected to an output OUT. Output OUT may be buffered by inverters (4724-0/1) to generate output signal S_OUT.

In response to a signal WL, voltage selector 4722-0 may provide voltage source VIN0 as selected voltage V0, and voltage selector 4722-1 may provide voltage source VIN1 as selected voltage V1. Voltage selector 4722-2 may provide voltage VIN2 as a select voltage V2 in response to signal WL and control signal PE4. In the particular example shown, voltage selectors (4722-0/1) may be n-channel insulated gate (referred to herein as NMOS) transistors. Voltage selector (4722-3) may be two NMOS transistors with source-drain paths arranged in series.

In a program or erase operation, enable signal EN may isolate inputs (IN0 to IN3) from corresponding cells (4720-0 to 4720-3). A select signal (SL0 to SL3) may select one cell (4720-0 to 4720-3) for programming or erase. Voltage selectors (4722-0 to 4722-3) will apply selected voltages V0-V2 to the cells (4720-0 to 4720-3). Selector signals (PE[0:3]) will then sequentially select each programmable impedance element within a cell (4720-0 to 4720-3) to apply selected voltages (V0-V2), and thereby program or erase such an element.

In a standard operation (i.e., MUX functions as a signal path), enable signal may enable inputs (IN0 to IN3), while signals (SL0 to SL3) may all be inactive, preventing selection of any cell for programming or erase. Voltage selectors (4722-0 to 4722-3) may all have a high impedance, preventing voltages V0-V2 from being applied to cells (4720-0 to 4720-3). Selector signals (PE[0:3]) may remain inactive, preventing the selection of any programmable resistance elements.

Figure 48:
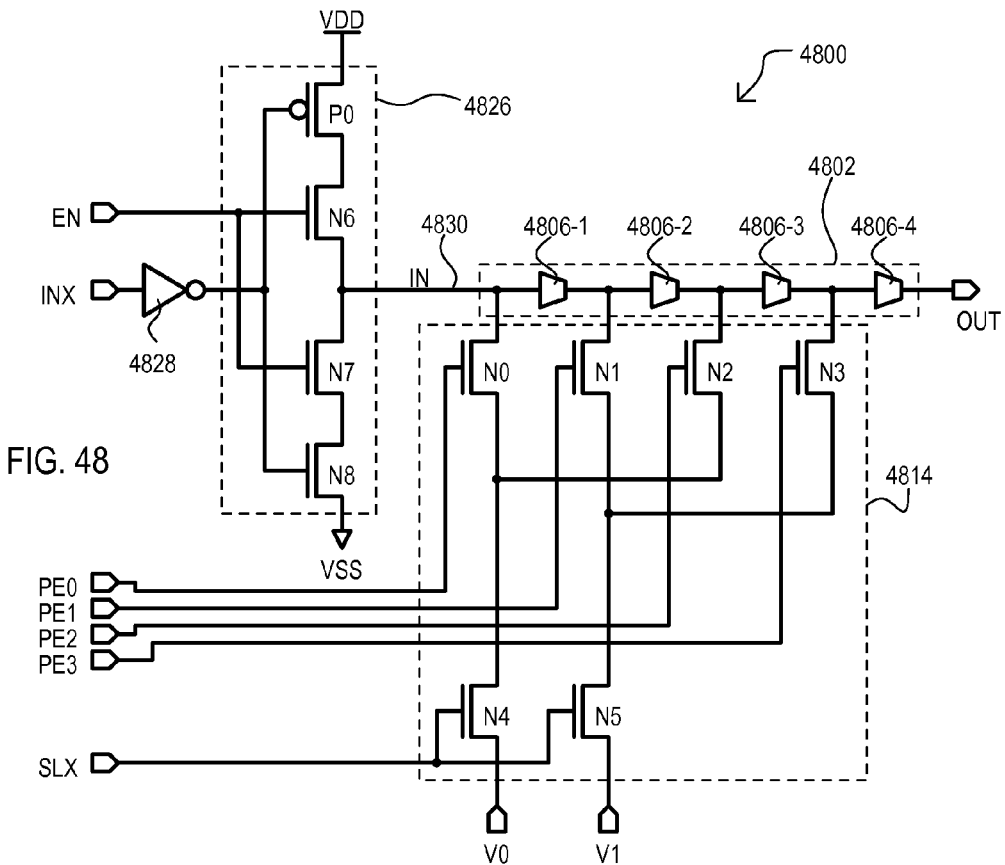
FIG. 48 is a schematic diagram of a programmable impedance cell according to an embodiment.

Referring now to FIG. 48, a programmable impedance cell according to one embodiment is shown in a schematic diagram, and designated by the general reference character 4800. A programmable impedance cell 4800 may be one example of those shown as any of 4720-0 to 4720-3 in FIG. 47. A cell 4800 may include a programmable link 4802, a selection circuit 4814, and three state input circuit 4826.

A programmable link 4802 may include two or more series connected programmable impedance elements (4806-1 to 4806-4), which in this embodiment includes four PMCs.

A selection circuit 4814 may selectively apply select voltages V0 and V1 to anode/cathodes of PMCs (4806-1 to 4806-4) in response to a select signal SLX and selector signals PE[0:3]. In the embodiment shown, selection circuit 4814 may include switches N0 to N5, which in this embodiment, may be NMOS transistors. As shown by FIG. 48, in response to signal SLX, select voltage V0 will be supplied to N0 and N2 by operation of N4, and voltage V1 will be supplied to N1 and N3 by operation of N5. N0 has a source-drain path connected to an anode of PMC 4806-1, and a gate that receives selector signal PE0. N1 has a source-drain path connected between PMCs 4806-1/2, and a gate that receives selector signal PE1. N2 has a source-drain path connected between PMCs 4806-2/3, and a gate that receives selector signal PE2. N3 has a source-drain path connected between PMCs 4806-3/4, and a gate that receives selector signal PE3.

A three state input circuit 4826 may selectively apply an input INX to programmable link 4802 based on enable signal EN. In the particular embodiment shown, a three state input circuit 4826 may include a p-channel MOS (PMOS) transistor P0, and NMOS transistors N6, N7 and N8, all having source-drain paths arranged in series between a high power supply (VDD) and a low power supply (VSS). Gates of P0 and N8 may receive input INX via an inverter 4828. Gates of N6 and N7 may receive enable signal EN. A source-drain connection of N6/N7 may provide an output node 4830 that serves as an input to programmable link 4802. Thus, when signal EN is high, three state input circuit 4826 drives output node 4830 according to signal INX. When signal EN is low, output node 4830 may be isolated from VDD/VSS and thus is placed in to a high impedance state.

Figure 49:
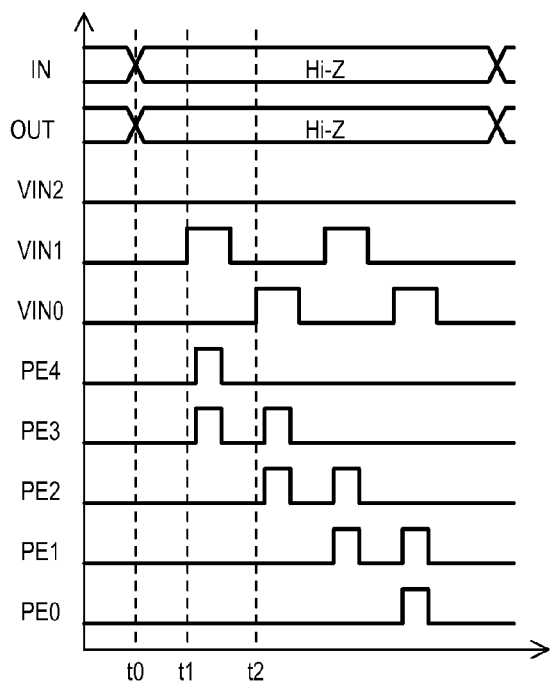
FIG. 49 shows a program operation of a circuit like that of FIG. 48.

FIG. 49 shows a programming operation for a circuit like that of FIG. 48, that places programmable link 4802 into a low impedance state. It is assumed that elements 4806-1 to 4806-4 are all initially in a high impedance state. The illustrated operation programs each element (4806-1 to 4806-4) individually into a low impedance state in the order 4806-4→4806-3→4806-2→4806-1.

At about time t0, input (IN) node 4830 and output (OUT) may be placed into high impedance states. Signals PE4 to PE0 may all be inactive (low), placing switches (N0 to N3) into an open state. It is assumed that select signal SLX is activated, and remains activated until element 4806-1 is programmed.

At about time t1, voltage sources VIN2 and VIN0 may remain low, while voltage source VIN1 may rise to a high voltage. Subsequently, selector signals PE4 and PE3 may be activated, applying a high voltage (VIN1=high) to an anode of element 4806-4, and a low voltage (VIN2=low) to a cathode of element 4806-4. At this time, VIN1−VIN2>Vtp, and element 4806-4 may be programmed to a low impedance state.

At about time t2, voltage sources VIN2 may remain low, while voltage source VIN1 may fall to a low level and voltage source VIN0 rises to a high voltage. Subsequently, selector signals PE3 and PE2 may be activated, applying a high voltage (VIN0=high) to an anode of element 4806-3, and a low voltage (VIN1=low) to a cathode of element 4806-3. At this time, VIN0−VIN1>Vtp, and element 4806-4 may be programmed to a low impedance state.

The above procedure may be repeated for the remaining elements, as shown in FIG. 49, with element 4806-2 being programmed to a low impedance state, followed by element 4806-1 being programmed to a low impedance state.

Figure 50:
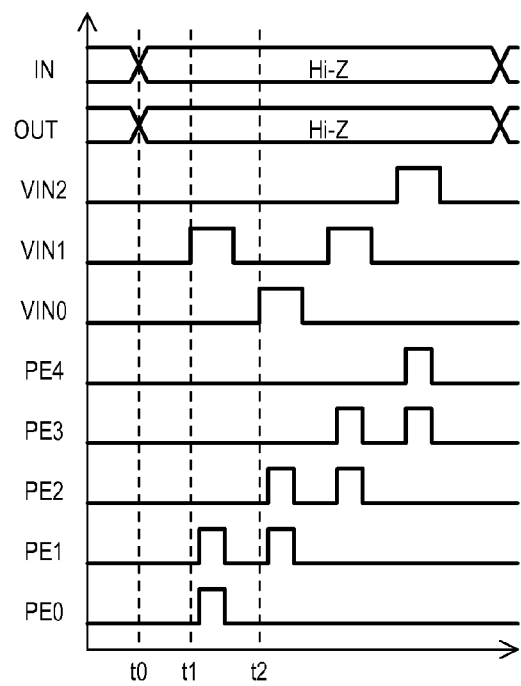
FIG. 50 shows an erase operation of a circuit like that of FIG. 48.

FIG. 50 shows an erase operation for a circuit like that of FIG. 48 that places programmable link 4802 into a high impedance state. It is assumed that elements 4806-1 to 4806-4 are all initially in a low impedance state. The illustrated operation erases each element (4806-1 to 4806-4) individually into a high impedance state, in the order 4806-1→4806-2→4806-3→4806-4.

At about time t0, input (IN) and output (OUT) may be placed into high impedance states. Signals PE4 to PE0 may all be inactive (low), placing switches (N0 to N3) into an open state. It is assumed that select signal SLX is activated, and remains activated until element 4806-4 is erased.

At about time t1, voltage source VIN2 and VIN0 may remain low, while voltage source VIN1 may rise to a high voltage. Subsequently, selector signals PE0 and PE1 may be activated, applying a low voltage (VIN0=low) to an anode of element 4806-1, and a high voltage (VIN1=high) to a cathode of element 4806-1. At this time, VIN0−VIN1<Vte (where Vte is a negative value), and element 4806-1 may be erased to a high impedance state.

At about time t2, voltage source VIN1 may fall to a low voltage, while voltage source VIN0 may rise to a high low voltage. Subsequently, signals PE2 and PE3 may be activated, applying a high voltage (VIN0=high) to a cathode of element 4806-2, and a low voltage (VIN1=low) to an anode of element 4806-2. At this time, VIN1−VIN0<Vte, and element 4806-2 may be erased to a high impedance state.

The above procedure may be repeated for the remaining elements, as shown in FIG. 3-21, with element 4806-3 being erased to a high impedance state, followed by element 4806-4 being erased to a high impedance state utilizing voltage source VIN2 at output node OUT.

Figure 51:
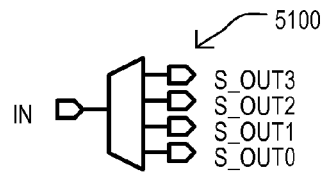
FIG. 51 is a block schematic diagram of a programmable demultiplexer (deMUX) according to an embodiment.

Referring to FIG. 51, an integrated circuit device circuit according to another embodiment is shown in a block schematic diagram and designated by the general reference character 5100. Device 5100 may be one particular example of that shown as 308 in FIG. 3.

A circuit 5100 may be a de-multiplexer (deMUX). DeMUX circuit 5100 may selectively connect one input (IN) to one of multiple outputs (S_OUT0 to S_OUT3). Such a connection may be made by altering the conductivity of a programmable link that includes a series connection of multiple programmable resistance elements.

In this way, a programmable deMUX may be configured by programming link elements that include series connected programmable impedance elements.

Figure 52:
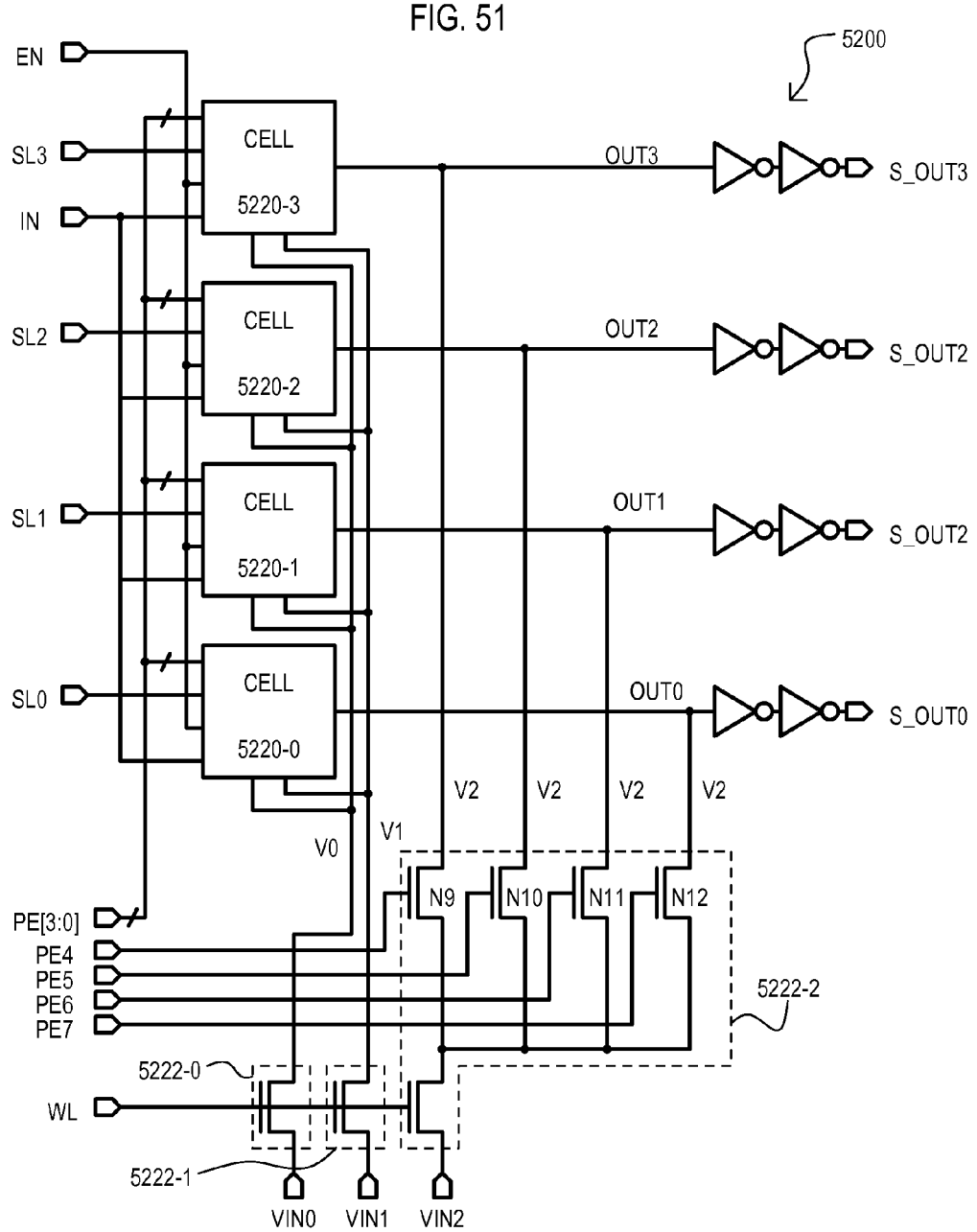
FIG. 52 is a block schematic diagram of a programmable deMUX according to another embodiment.

Referring now to FIG. 52, a programmable deMUX circuit according to an embodiment is shown in a block schematic diagram and designated by the general reference character 5200. A programmable deMUX 5200 may one particular implementation of that shown in FIG. 51.

A programmable deMUX 5200 may include a cell 5220-0 to 5220-3 corresponding to each input, as well as voltage selectors 5222-0, 5222-1 and 5222-3.

In one embodiment, each cell may operate in the same general fashion as described for items 4720-0 to 4720-3 in FIG. 47.

In response to a signal WL, voltage selector 5222-0 may provide voltage source VIN0 as selected voltage V0, and voltage selector 5222-1 may provide voltage source VIN1 as selected voltage V1. Voltage selector 1822-2 may provide voltage VIN2 as a select voltage V2 to any of outputs OUT3 to OUT0 in response to selector signals PE[4:7], respectively.

In a program or erase operation, enable signal EN may isolate input (IN) from corresponding cells (5220-0 to 5220-3). A select signal (SL0 to SL3) may select one cell (5220-0 to 3220-3) for programming or erase. Voltage selectors (5222-0 to 5222-3) may apply selected voltages V0-V2 to the cells (5220-0 to 5220-3) and to a corresponding output OUT0 to OUT3. Selector signals (PE[0:3]) may then sequentially select each of programmable impedance elements within each selected cell (5220-0 to 1820-3) to apply selected voltages (V0-V2), and thereby program or erase the elements.

In a standard operation (i.e., deMUX functions as a signal path), enable signal may enable input (IN), while signals (SL0 to SL3) may all be inactive, preventing selection of any cell for programming or erase. Voltage selectors (5222-0 to 5222-3) may all have a high impedance, preventing voltages V0-V2 from being applied to cells (5220-0 to 5220-3). Selector signals (PE[0:3]) may remain inactive, preventing the selection of any programmable resistance elements.

Figure 53:
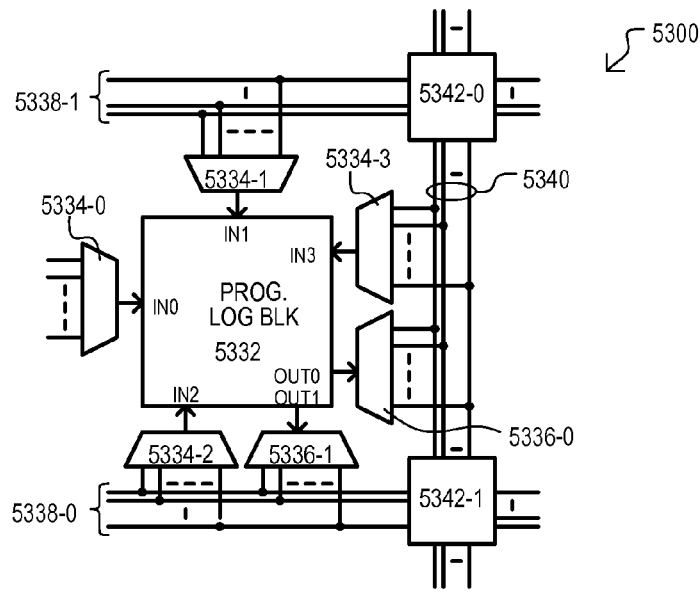
FIG. 53 is a block schematic diagram of a configurable integrated circuit device according to a further embodiment.

Referring now to FIG. 53, an integrated circuit according to another embodiment is shown in a block schematic diagram and designated by the general reference character 5300. Device 5300 may be one particular example of that shown as 308 in FIG. 3.

Referring to FIG. 53 an integrated circuit may include a programmable architecture that includes a programmable logic block 5332, programmable MUXs (5334-0 to 5334-3), programmable deMUXs (5336-0 and 5336-1), horizontal wiring channels (5338-0 and 5338-1), vertical wiring channel 5340, and switch boxes (5342-0 and 5342-1).

Programmable logic block 5332 may receive input values at any or all of inputs IN0 to IN3, and execute a predetermined logic operation of such functions to provide output values at any or both of outputs OUT0 to OUT1. The predetermined logic function may be programmable based on programmable elements. In one embodiment, such a logic function may be based on the same type of programmable elements included in any or all of programmable MUXs (5334-0 to 5334-3), programmable deMUXs (5336-0 and 5336-1), and/or switch boxes (5342-0 and 5342-1). In one very particular example, the programmable logic function may be established by programming PMCs elements.

Programmable MUXs (5334-0 to 5334-3) may selectively connect signal(s) from a corresponding wiring channel, and provide such signal(s) as input value(s) to programmable logic block 5332. In the example shown, MUX 5334-1 connects horizontal wiring channel 5338-1 to block 5332, MUX 5334-2 connects horizontal wiring channel 5338-0 to block 5332, and MUX 5334-3 connects vertical wiring channel 5340 to block 5332. It is noted that MUXs (5334-0 to 5334-3) may include multiple levels and provide more than one input signal to block 5332. Selective connections from MUXs (5334-0 to 5334-3) may be based on series connected programmable impedance elements, such as PMCs as but one example.

In one very particular embodiment, any or all of MUXs (5334-0 to 5334-3) may include structures like those shown in FIGS. 46-48, or equivalents.

Programmable deMUXs (5336-0 and 5334-6) may selectively connect signal(s) from a programmable logic block 5332 to a corresponding wiring channel. In the example shown, deMUX 5336-0 connects block 5332 to vertical wiring channel 5340, and deMUX 5336-1 connects block 5332 to horizontal wiring channel 5338-0. As in the cases of MUXs (5334-0 to 5334-3), deMUXs (5336-0 and 5336-1) may include multiple levels and receive more than one output signal from block 5332. Selective connections from deMUXs (5336-0 and 5331-1) may be based on series connected programmable impedance elements, such as PMCs as but one example.

In one very particular embodiment, either or both of deMUXs (5336-0 or 5336-1) may include structures like those shown in FIGS. 51-52, or equivalents.

Switch boxes (5342-0 and 5342-1) may selectively connect lines of wiring channels to one another. In the very particular example shown, switch boxes (5342-0 and 5342-1) may be formed at the intersection of two vertical wiring channels and two horizontal wiring channels. Selective connections within switch boxes (5342-0 and/or 5342-1) may be based on series connected programmable impedance elements, such as PMCs as but one example.

Figure 54:
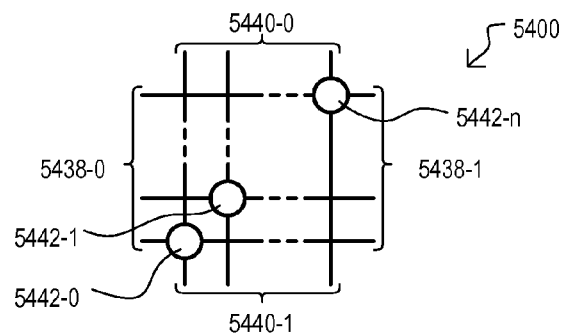
FIG. 54 is a block schematic diagram of a switch box according to an embodiment.

Referring now to FIG. 54, a switch box according to one embodiment is shown in a schematic diagram, and designated by the general reference character 5400. A switch box 5400 may be one example of a structure that may be included in switch boxes (5342-0 and 5342-1) of FIG. 53.

Switch box 5400 may be formed at an intersection of horizontal wiring channels 5438-0/1 and horizontal wiring channels 5440-0/1. Within switch box 5400, a programmable switching element (5442-0 to 5442-*n*) may be formed at an intersection of four conductive lines from different wiring channels. A programmable switching element (5442-0 to 5442-*n*) may selectively connect one conductive line to one or more other conductive lines with programmable links that includes series connected programmable impedance elements, such as PMCs as but one example.

Figure 55:
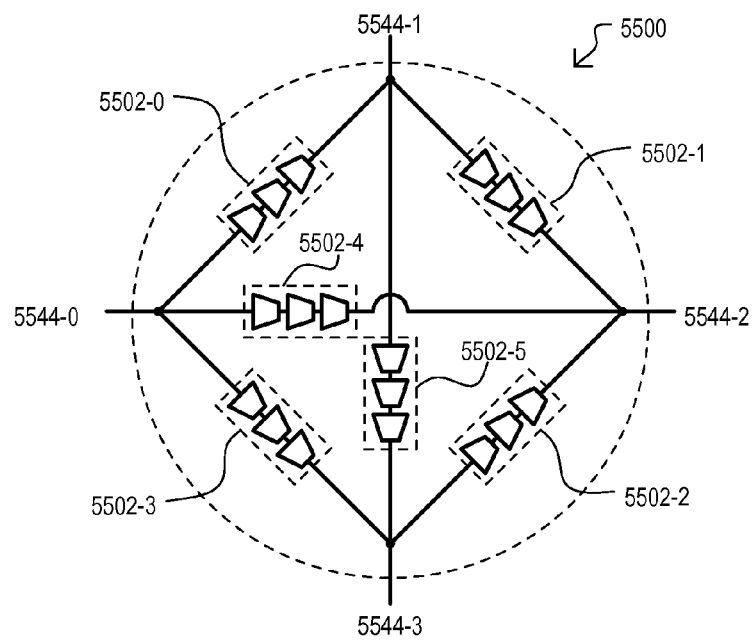
FIG. 55 is a block schematic diagram of a programmable switching element according to an embodiment.

Referring now to FIG. 55, a programmable switching element according to one embodiment is shown in a schematic diagram, and designated by the general reference character 5500. A programmable switching element 5500 may be one example of a structure that may be included in a switching element (5442-0 and 5442-1) of FIG. 54.

Switching element 5500 may include programmable links 5502-0 to 5502-5 that provide programmable conductive connections between conductive lines 5544-0 to 5544-3. Programmable links (5502-0 to 5502-5) may be formed from series connected programmable impedance elements, and in the particular example shown, each are formed by a series connection of three PMCs.

Programmable link 5502-0 may provide a programmable connection between conductive lines 5544-0 and 5544-1. Programmable link 5502-1 may provide a programmable connection between conductive lines 5544-1 and 5544-2. Programmable link 5502-2 may provide a programmable connection between conductive lines 5544-2 and 5544-3. Programmable link 5502-3 may provide a programmable connection between conductive lines 5544-3 and 5544-0. Programmable link 5502-4 may provide a programmable connection between conductive lines 5544-0 and 5544-2. Programmable link 5502-5 may provide a programmable connection between conductive lines 5544-1 and 5544-3.

Programmable links (5502-0 to 5502-5) may be programmed to high or low impedance states according to any of the embodiments shown herein, or equivalents.

Referring now to FIG. 56, the structure of a conventional programmable link 5600 is shown in a side cross sectional view. A gating transistor 5646 may be formed to connect a first logic section 5604-0 with a second logic section 5604-1. A gating transistor 5646 may be a relatively large device to ensure low on resistance, and/or may work in tandem with another such transistor of opposite conductivity type. Thus, in a conventional structure, substrate area is provided for an active device to create a programmable link structure.

Referring now to FIG. 57, a programmable link structure 5700 according to an embodiment is shown in a side cross sectional view. As shown in the figure, a programmable link 5702 may be formed above transistors of logic sections (5704-0 and 5704-1). Accordingly, in the embodiment of FIG. 57, substrate area may not be utilized to provide a programmable connection.

Referring now to FIG. 58, a conventional programmable link circuit is shown in a block schematic diagram and designated by the general reference character 5800. A gating transistor 5846 has its conductivity controlled by a latch 5848. A latch 5848 may be loaded by an address write circuit 5850. Each of circuit sections 5846, 5848 and 5850 may occupy a different portion of an overall integrated circuit die.

Referring now to FIG. 59, a programmable link circuit according to one embodiment is shown in block schematic diagram and designated by the general reference character 5900.

A programmable link circuit 5900 may include a program/erase circuit 5952. Formed over such a circuit 5952 may be programmable link 5902, which may be formed from series connected programmable impedance elements. Such programmable resistance elements may be formed from PMCs in one embodiment.

Thus, program/erase circuit 5952 may occupy a same portion of a circuit area as the programmable elements its erases and/or programs.

While embodiments shown in above include circuits that both program and erase programmable impedance elements, other embodiments may include one time programmable impedance elements. In such cases erase circuitry and potentials (or alternatively, program circuitry and potentials) may not be included.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
at least a memory section that stores data in programmable impedance elements arranged at cross points of select lines and sub bit lines, groups of sub bit lines each being connected to a different main bit line, the elements being formed above a substrate surface
the memory section further including
at least a first voltage select circuit configured to couple one of a plurality of different first voltages to a main bit line in a data write operation to at least one programmable impedance element, and
at least a second voltage select circuit configured to couple one of a plurality of different second voltages to a select line in the data write operation to the programmable impedance element.

2. The integrated circuit of claim 1, wherein:
the elements comprise programmable metallization cells (PMCs).

3. The integrated circuit of claim 1, wherein:
the sub bit lines are formed above the substrate surface and the select lines are formed over the sub bit lines.

4. The integrated circuit of claim 1, wherein:
the sub bit lines are formed above the substrate surface and the main bit lines are formed over the sub bit lines.

5. The integrated circuit device of claim 1, wherein:
each sub bit line is coupled to its corresponding main bit line by an access transistor formed in the substrate.

6. The integrated circuit device of 1, further including:
a configurable circuit section that includes
at least one programmable link that selectively connects a signal input to a signal output, the programmable link comprising a plurality of programmable impedance elements arranged in series with one another between the signal input and output.

7. The integrated circuit of claim 6, wherein:
the programmable link includes at least two chains of programmable impedance elements coupled in parallel with one another to lower an impedance of the programmable link, each chain including at least two programmable impedance elements arranged in series.

8. The integrated circuit of claim 6, further including:
the programmable link includes N programmable impedance elements, each of which changes its impedance when a voltage across the element exceeds a threshold voltage magnitude |Vt|; and
a voltage application circuit that applies a voltage greater than a magnitude N*|Vt| across the N programmable impedance elements to alter an impedance of the entire programmable link.

9. An integrated circuit device, comprising:
a memory section that includes
a plurality of programmable impedance elements,
a plurality of select lines, each configured to be driven to separate select voltages, and
a plurality of sub bit lines organized into groups, each sub bit line of the same group being coupled to a same main bit line by a corresponding select device; wherein
at least the sub bit lines, main bit lines, and programmable impedance elements are formed above an integrated circuit device substrate, and each programmable impedance element is coupled between a different sub bit line-select line combination;
at least a first voltage select circuit configured to couple one of a plurality of different first voltages to a main bit line in a data write operation to at least one programmable impedance element; and
at least a second voltage select circuit configured to couple one of a plurality of different second voltages to a select line in the data write operation to the programmable impedance element.

10. The integrated circuit device of claim 9, wherein:
each programmable impedance element includes an anode coupled to the corresponding select line, and a cathode coupled to the corresponding sub bit line.

11. The integrated circuit of claim 9, wherein:
the elements comprise programmable metallization cells (PMCs).

12. The integrated circuit of claim 9, further including:
a configurable section comprising
a plurality of circuit sections, and
at least one programmable link formed between at least two circuit sections, the programmable link comprising a plurality of programmable impedance elements coupled in series with one another, and configurable to provide or prevent an electrical signal between the two circuit sections.

13. The integrated circuit device of claim 12, wherein:
the configurable section further includes
a link program circuit comprising at least
a first switch coupled to a first programmable impedance element of a corresponding link and configured to selectively apply a first link voltage, and
a last switch coupled to a last programmable impedance element of the corresponding link and configured to selectively apply a second link voltage.

14. The integrated circuit device of claim 13, wherein:
the number of programmable impedance elements in the link is N, and each programmable impedance element changes impedance when a voltage across it is greater than a threshold voltage Vt; and
a difference between the first and second link voltages is greater than N*Vt.

15. The integrated circuit of claim 13, wherein:
the link program circuit further includes an intermediate switch coupled between common terminals of adjacent programmable impedance elements, and configured to selectively apply an intermediate link voltage.

16. An integrated circuit, comprising:
a memory section configured to store data in programmable impedance elements arranged at cross points of select lines and sub bit lines, groups of sub bit lines each being connected to a different main bit line, the elements being formed above a substrate surface; and
a configurable section that includes
a plurality of circuit sections, and
a plurality of links programmable to provide signal paths between the circuit sections, each link including a plurality of programmable impedance elements arranged in series.

17. The integrated circuit of claim 16, wherein:
the configurable section further includes
a link program circuit comprising at least
a first switch coupled to a first programmable impedance element of a corresponding link and configured to selectively apply a first link voltage, and a last switch coupled to a last programmable impedance element of the corresponding link and configured to selectively apply a second link voltage.

18. The integrated circuit device of claim 17, wherein:
the link program circuit further includes a first intermediate switch coupled between common terminals of adjacent programmable impedance elements, and configured to selectively apply at least a first intermediate link voltage.

19. The integrated circuit of claim 18, further including:
the link program circuit further includes a second intermediate switch coupled between common terminals of adjacent programmable impedance elements, and configured to selectively apply at least a second intermediate link voltage.

* * * * *